United States Patent
Yamazaki et al.

[11] Patent Number: 5,932,302
[45] Date of Patent: Aug. 3, 1999

[54] METHOD FOR FABRICATING WITH ULTRASONIC VIBRATION A CARBON COATING

[75] Inventors: Shunpei Yamazaki, Tokyo; Kenji Itoh; Shigenori Hayashi, both of Kanagawa, all of Japan

[73] Assignee: Semiconductor Energy Laboratory Co., Ltd., Kanagawa-ken, Japan

[21] Appl. No.: 08/909,573

[22] Filed: Aug. 13, 1997

Related U.S. Application Data

[62] Division of application No. 08/841,639, Apr. 30, 1997, which is a continuation of application No. 08/276,327, Jul. 18, 1994, abandoned.

[30] Foreign Application Priority Data

| Jul. 20, 1993 | [JP] | Japan | 5-200251 |
| Jul. 22, 1993 | [JP] | Japan | 5-201833 |
| May 9, 1994 | [JP] | Japan | 6-119632 |

[51] Int. Cl.$^6$ .............. B05D 3/06; C23C 16/26; B06B 1/00
[52] U.S. Cl. .......... 427/577; 427/600; 427/249; 427/255.5; 427/127
[58] Field of Search .............. 427/577, 600, 427/249, 127, 255.5

[56] References Cited

U.S. PATENT DOCUMENTS

| 4,438,723 | 3/1984 | Cannella et al. | 118/718 |
| 4,534,816 | 8/1985 | Chen et al. | 156/345 |
| 4,871,581 | 10/1989 | Yamazaki | 118/723 |
| 4,987,856 | 1/1991 | Heyes et al. | 118/715 |
| 4,995,341 | 2/1991 | Matsuyama | 118/723 |
| 5,110,437 | 5/1992 | Yamada et al. | 204/298.33 |
| 5,123,376 | 6/1992 | Kaneko et al. | 118/718 |
| 5,203,924 | 4/1993 | Mitani et al. | 118/719 |
| 5,224,441 | 7/1993 | Felts et al. | 118/718 |
| 5,360,483 | 11/1994 | Kurokawa et al. | 118/723 E |
| 5,376,402 | 12/1994 | Louks et al. | 427/600 |
| 5,569,502 | 10/1996 | Koinuma et al. | 427/600 |

FOREIGN PATENT DOCUMENTS

| 62-83471 | 4/1987 | Japan . | |
| 2-62418 | 11/1987 | Japan | 118/723 E |
| 2-026894 | 1/1990 | Japan . | |
| 3-174397 | 7/1991 | Japan . | |
| 3-247769 | 11/1991 | Japan | 118/723 E |

OTHER PUBLICATIONS

J.W. Coburn in "Plasma Etching and RIE" AVS Monograph Series, 1982, pp. 6–11. No month data!.

*Primary Examiner*—Roy V. King
*Attorney, Agent, or Firm*—Sixbey, Friedman, Leedom & Ferguson, PC; Eric J. Robinson

[57] ABSTRACT

In a process for fabricating a carbon coating, an object such as a magnetic recording medium is disposed on a side of an electrode connected to a high-frequency power supply. Ultrasonic vibrations are supplied to the object. Discharge is generated between the electrode connected to the high-frequency power supply and a grounded electrode to fabricate a carbon coating on the surface of the object. Also, an electrode interval is set to 6 mm or less, pressure between the electrodes is set to 15 Torr to 100 Torr, whereby high-density plasma is generated to form an ion sheath on an anode side. Therefore, a coating is fabricated on the surface of the object by bombardment of ions and the coating contains pin-holes having a density of 30/mm$^2$ or less.

36 Claims, 15 Drawing Sheets

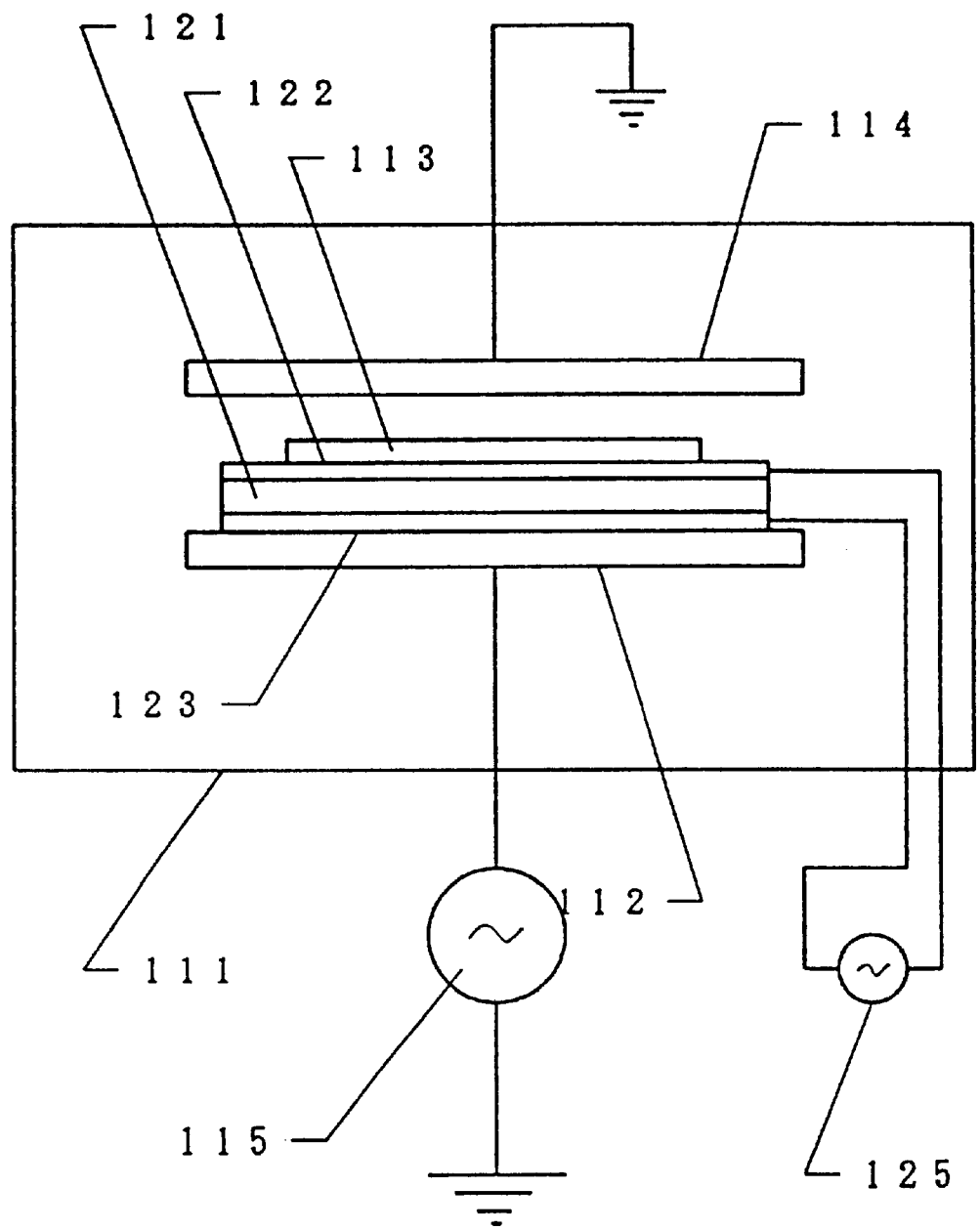
F I G. 1

METHOD FOR FABRICATING WITH ULTRASONIC VIBRATION A CARBON COATING

This is a Divisional application of Ser. No. 08/841,639, filed Apr. 30, 1997; which itself is a continuation of Ser. No. 08/276,327, filed Jul. 18, 1994, now abandoned.

BACKGROUND OF THE INVENTION

1. Field of the Invention

The present invention relates to an apparatus for fabricating a hard carbon coating to be prepared as a surface protective film for a magnetic tape, an optical magnetic disc or the like, and a method of manufacturing such a hard carbon coating. Further, the present invention relates to an apparatus for manufacturing a magnetic disc medium having high durability and high recording density and excellent in productivity on a polymeric substrate material, and more particularly to an apparatus for manufacturing a protective film having functions of wear resistance and lubricating ability, which is industrially applied to an image equipment, an information equipment field and the like.

2. Description of the Related Art

Hitherto, there has been known a technique by which a diamond-shaped carbon coating is formed. The diamond-shaped carbon coating has a diamond structure and is also called a diamond-like carbon (DLC) film. Hereinafter, this carbon coating is referred to as "hard carbon coating".

The hard carbon coating is coated on a surface of resin or a polymeric film and can be used as a wear-resistant layer or a protective layer. When manufacturing the hard carbon coating, a film forming apparatus such as a plasma CVD apparatus shown in FIG. 2 is used. In the film forming apparatus shown in FIG. 2, a pair of electrodes 112 and 114 are disposed within a vacuum vessel 111. One electrode 112 is connected to a high-frequency power source 115 (generally, 13.56 MHz) whereas the other electrode 114 is grounded. An object or a substrate 113 on which a film is to be formed is disposed on the electrode 112 side to which a high-frequency power (voltage) is supplied. Also, although not shown, a supply system, an exhaust system for a reactive gas, and a matching device for supplying voltage are provided.

In the plasma CVD apparatus shown in FIG. 2, electrons are charged onto the substrate 113 and the electrode 112 (electrode opposed to the grounded electrode 114) connected to the high-frequency power source 115. Therefore, $H^+$-ions and H-radicals contributing to heightened quality of the film by action of self-bias collide with the object 113, thereby to prepare the carbon coating having the diamond structure.

The hard carbon coating thus prepared can be used as the protective film of the magnetic recording medium such as a magnetic tape or an optical magnetic disc, etc. Since these magnetic recording media are made of magnetic material, it is necessary to protect the media from being mixed with a foreign matter or being damaged. For example, a DC bias is applied in addition to high-frequency discharge, whereby a carbon coating in which pin-holes of $10^2$ to $10^5$ per $mm^2$ are formed is prepared on a surface of the magnetic recording medium.

However, according to the experiments of the inventors, it has been ascertained that the hard carbon coating having the pin-holes therein lacks long-term reliability as a protective film because moisture is infiltrated into the pin-holes. Also, it has been ascertained that improvements in hardness and adhesion of the hard carbon coating and the prevention of generation of the pin-holes are not always performed together.

Recently, there is a tendency to heighten the density of the magnetic recording medium. As a conventional magnetic recording medium, there has been known a coating type in which $\gamma$-$Fe_2O_3$ powders, CrO powders, pure iron powders or the like which are used for an audio or video tape material are coated on a polymeric substrate material together with an abrasive material and a binder. Further, a high performance magnetic recording medium on which a metal magnetic material has been vapor-deposited is used.

Furthermore, there has been known a technique by which a coating mainly containing carbon (also called a carbon film, a DLC or a hard carbon film) is formed on a surface of these magnetic recording medium, thereby to obtain a surface protection, a wear resistance or a lubricating ability. In general, the coating mainly containing carbon is fabricated by the CVD method typical of the plasma CVD method.

In the typical plasma CVD method, a substrate is located on a high-frequency voltage supply electrode (cathode) side, and a self-bias formed in the vicinity of the cathode allows a high-hard film to be fabricated. In general, a carbon film with a high hardness cannot be fabricated on a grounded electrode (anode) side.

When a coating mainly containing carbon is formed using the plasma CVD method of the parallel plate type, an organic resin substrate constituting an object of the magnetic recording medium must be located on a cathode electrode side. The magnetic recording medium for high-density recording is generally obtained by vapor-depositing the metal magnetic material. Therefore, if such an object is in contact with the cathode electrode, the object constitutes a part of the electrode, and therefore a high-frequency electric field is leaked as a result of which discharge occurs in an undesired region. There is a high possibility that the organic resin film constituting the object is damaged by such discharge, causing a problem on the stability and reliability of production.

Furthermore, fabricating the hard carbon film which is a protective film at the same time as the roll to roll type magnetic layer fabricating process is impossible because the carbon film forming speed is low.

SUMMARY OF THE INVENTION

An object of the present invention is to provide a method of forming a novel hard carbon coating.

Another object of the invention is to provide a method of fabricating a hard carbon coating which is fine, has high hardness and adhesion and reduces the number of pin-holes formed therein as a protective film of a magnetic recording medium.

Still another object of the invention is to provide an apparatus capable of stably producing a hard carbon film on a surface of a magnetic recording medium including an electrically conductive metal magnetic layer with high reliability, that is, to provide an apparatus capable of fabricating a carbon film having a sufficient wear-resistance and lubricating ability under the condition where it is in contact with an anode which constitutes a grounded electrode.

Yet still another object of the invention is to provide an apparatus capable of forming a film at a high speed to the degree of being capable of fabricating a hard carbon film which is a protective film at the same time as a process of fabricating a magnetic layer.

Yet still another object of the invention is to provide an apparatus capable of restraining generation of a flake caused by a stain of an electrode, by forming a film at a high speed.

In the present invention, the hard carbon coating is fabricated while an object is subjected to ultrasonic vibrations. In particular, in the plasma CVD apparatus constituted by a parallel plate in which a high-frequency power supply is connected to one electrode on a side where the substrate on which the hard carbon coating is to be formed is located, and the other electrode is grounded, the carbon coating is fabricated under the condition where the ultrasonic vibrations is propagated to the substrate.

Further, in the present invention, a magnetic recording medium such as a band-shaped film object (for example, a taped film) or the like is used for an object, this object travels while it is subjected to ultrasonic vibrations, and the hard carbon coating is fabricated on the surface of the object (substrate) as a protective film.

By subjecting the object to ultrasonic vibrations, cluster-shaped carbon of small particles or carbon molecules can be deposited on the surface of the object, and the carbon coating formed can be fine and uniform in quality. This is because the object is ultrasonic-vibrated, whereby large carbon molecules is repelled from the substrate which is vibrating and molecules having a specified size or less are liable to be deposited on the surface of the object.

Further, a film shaped object is used for an object, and the object vibrates in a direction of an inter-electrode, thereby to realize a state where bias is applied in a pulse mode or a high-frequency mode.

Still further, the number of pin-holes per 1 $mm^2$ in the hard carbon coating is 30 or less. The thickness of the hard carbon coating is 50 to 2000 Å, preferably 100 to 500 Å.

If at lease one kind of element selected from Si, B, N, P and F is contained by 20 atoms % or less in a hard carbon coating used as this protective film, adhesion of the coating is improved to provide electrical conductivity. For example, Si and P are contained in the hard carbon coating, thereby to obtain a protective film having high conductivity and making it difficult to charge with static electricity.

When using a slender film-shaped object such as a magnetic tape, ultrasonic vibrations are given to the object, thereby being capable of preventing the substrate from being contracted. Also, particles (a powder like raw material which does not come to a film) attached to the surface of the substrate can be removed by ultrasonic vibrations.

Further, ultrasonic vibrations are given to the substrate in the direction of the inter-electrode arranged in parallel, thereby to realize a state where AC bias voltage is applied between electrodes. This action is particularly effective in the case of using a film-shaped substrate such as a magnetic tape which is flexible and has a large amplitude.

According to the present invention, in an apparatus for fabricating a coating in which a first electrode to which high-frequency electric field is applied and a grounded second electrode are arranged so as to be opposed to each other, high-frequency electric field is applied to generate plasma between the first and second electrodes, and raw gas introduced in the plasma is activated to fabricate a coating, an interval between the first and second electrodes is 6 mm or less, pressure between the electrodes is 15 to 100 Torr. That is, when the electrode interval is 6 mm or less and pressure therebetween is 15 to 100 Torr, even though the substrate is in contact with the second electrode, the carbon film with high hardness can be fabricated. This is ascertained by the experimental view of the inventors.

Prior to the above-mentioned view, the inventors have observed the physical property of a plasma within a high pressure range (5 Torr to 760 Torr) remarkably higher than a pressure range (10 mTorr to 1 Torr) generally selected by the plasma CVD. The reason why attention is paid to the pressure range higher than what is generally expected is that the speed of film forming by the usual plasma CVD is desirable to improve excessively.

Considering film forming processes in the plasma CVD (generation of a radical, transport of the radical onto the surface of the substrate, and reaction of the radical on the surface), if (1) a radical density forming a precursor of a film, and (2) the transport efficiency of the radical onto the surface of the substrate can be improved, then a film forming speed can be improved. In the case of the plasma CVD, since the radical occurs in the whole plasma space, it can be presumed that the generation of the radical influences the film forming speed greater than the transport of the radical. The radical density can be increased by elevating a reaction pressure, and it can be expected that the film formation under high pressure results in a high-speed film formation.

In the film forming process, (3) the reaction of the radical on the surface of the film (suppression of surface desorption) is considered other than the above-mentioned cases (1) and (2). However, in the case of a low-temperature process such as the plasma CVD, the surface reaction rate is not determined, but the reaction process of the radical on the surface of the film to the film forming speed does not contributed thereto. In the case of forming the hard carbon film, the ion action on the surface greatly influences the film quality. That is, bombardment of ions positively acts while the hard carbon film is formed, whereby strong coupling in the film remains whereas weak coupling is cut off. Therefore, in general, the object is disposed on the cathode side, and a film is formed using self-bias.

Even though the increase in the radical density can be realized by pressure increase when forming a film, there is no sense in the case of greatly changing the physical property of plasma which is a premise of the radical generation by pressure rise. Accordingly, the inventors have observed plasma in high pressure range (5 Torr to 760 Torr), as mentioned above.

First, requirements for generating plasma in the high pressure range (5 Torr to 760 Torr) must be set. The reason that low-pressure glow discharge is conventionally generated in a pressure range of 10 mTorr to 1 Torr is because discharge is most liable to occur in this pressure range, that is, discharge is stabilized. The number of times when particles existing between the parallel plate electrodes having an electrode interval d (in the case of the usual low-pressure glow discharge, d=several tens mm) collide with electrons (it is assumed that electrons are accelerated by electric field between electrodes so as to fly from one electrode to the other electrode) is proportional to its atmospheric pressure. That is, the number of times is inverse proportional to a mean free stroke. Therefore, when the pressure is low and the number of times of collision is reduced, because electrons have sufficient energy, ionization of the particles is generated by that collision. However, due to low pressure, the particles per se are reduced thereby not forming plasma. On the other hand, when pressure is high, the number of collision times of electrons is increased whereby electrons cannot have sufficient energy till the succeeding collision, as a result of which the particles cannot be ionized even though they collide with the electrons. This is known as Paschen's law, and discharge start voltage V becomes a function of product (pd product) of pressure p and an electrode interval d, so that a minimum discharge start voltage Vmin exists when the pd product has a certain value. That is, when plasma is to be generated in a high-pressure range, it is required that sufficient electric field is given to electrons in order to ionize particles for a short free stroke.

To cope with this, the electrode interval d is narrowed and voltage applied between electrodes is heightened. There is a limit in an effect resulting from heightening the voltage applied between the electrodes. That is, in the case of glow discharge, an electric field distribution within plasma is not uniform so that an electric field is largest on a sheath portion formed in vicinity of the electrodes. Then, an electric field is developed on a positive column portion connected to the sheath portion. The length of the sheath portion is as long as a Debye length inherent to plasma, and the electric field of the positive column portion occupying most of space is not so large. Therefore, even though large voltage is applied between electrodes, a substantial increase of the electric field on the positive column portion occupying most of space cannot be much expected.

Because an increase in voltage between the electrodes is applied to the sheath portion, the ionization in this range is facilitated. When the electric field on the sheath portion exceeds a predetermined strength, accelerated electrons collides with the surface of the electrode, thereby to cause thermionic emission. A mechanism of discharging electronics from the electrode in a glow discharge state is field emission and secondary electron emission. However, when the thermionic emission is generated, the electric field consumed with electron emission from the electrode does not almost exist, and the electric field of that amount occurs on the sheath portion. In this case, electrons on the sheath portion is further accelerated whereby the electrode is heated. Accordingly, thermorunaway occurs as far as electrode potential is maintained. Such a state has negative resistance, and when current flows over the whole paths, discharge state shifts to arc discharge.

Consequently, it is effective to narrow the electrode interval in plasma generation within a high-pressure range. There exists a lower limit of the electrode interval. In order to allow plasma to exist, the electrode interval at least several times as long as a Debye distance is required. The Debye distance $\lambda$ is represented by the following expression.

$$\lambda = (\epsilon_0 \cdot \kappa \cdot Te/q^2 \cdot Ne)^{1/2}$$

where $\epsilon_0$ is the dielectric constant of vacuum, $\kappa$ is Boltzmann's constant, q is a charge elementary quantity, Te is temperature of electrons and Ne is density of electric charge.

Since plasma has the electric charge density of about $10^{15}/m^3$ and the electronic temperature of about 2 eV in an embodiment of the present invention, the Debye distance becomes about 0.3 mm. Therefore, the electrode interval is preferably 1 mm or more.

As mentioned above, although discharge in a pressure range of 1 Torr to 760 Torr is possible, the physical property of plasma is remarkably changed. In the pressure range of about 100 Torr to 760 Torr, as apparent from the abovementioned shift mechanism to arc discharge, the discharge is liable to be unstable in the usual electrode structure.

Consequently, a heat-resistant dielectric substance is applied onto the surface of the electrode so that a negative resistance is not exhibited in the whole system even though discharge exhibits a negative resistance. Since this dielectric substance has a positive resistance, the whole system provides a positive resistance. In this case, because the dielectric substance is connected in series in the equivalent circuit, it is necessary to make an a.c. electric field develop between the electrodes.

Further, in this range, pressure is high and possibility of collision and re-coupling of ions and electrons in a space is high, whereby plasma is liable to disappear. Therefore, it is necessary to facilitate diffusion of ions and electrons (in particular, diffusion of ions) so as to broaden a plasma region. For that purpose, it is effective to add rare gas having a matasable state, in particular, helium or argon. It is preferable that rare gas is 80% or more of the total gas.

Also, it is preferable to diffuse particles constituting plasma by the aid of a magnetic field. In particular, it is preferable to provide the distribution of a magnetic field so that a magnetic flux diverges from the center of the electrode toward the exterior. If such a magnetic field distribution can be obtained, then electrons drift along the diverged magnetic flux, and positive ions are attracted so that an electric field generated by the electrons is canceled, as a result of which plasma is diffused.

As mentioned above, within the pressure range of about 100 Torr to 760 Torr, it is necessary to insert a dielectric substance onto the surface of the electrode and to add rare gas. However, in the pressure of about 100 Torr or less, the dielectric substance and rare gas are not always necessary. However, the existence of the dielectric substance and rare gas under the pressure of about 100 Torr or less has such an effect that discharge is stabilized. However, there arises problems that the costs are increased and the film forming speed is lowered.

The inventors have observed the physical property of plasma under the pressure of 5 Torr to 750 Torr. Gas used in the experiment is argon, and electrodes between which a dielectric substance is inserted for stabilization of plasma is used. The dielectric substance is formed of a sintered alumina having a thickness of 0.5 mm, and a frequency is 13.56 MHz.

As a typical physical value of plasma, a sustaining voltage necessary for maintaining plasma, the electron temperature (Te), and the electron density (Ne) is measured. The electron temperature and the electron density are measured by using the Langmuir probe method (single probe method), and the sustaining voltage is measured by a terminal voltage of a power source. FIGS. 12 and 14 show measured results.

FIG. 14 shows the electron temperature (Te) and the electron density (Ne). Regarding the electron density, when the probe voltage is applied in a positive voltage direction, an electron saturated current region can be observed. However, there exists a pressure range (60 Torr or more) which cannot be observed in this region. Therefore, since the electron density cannot be calculated in the pressure range, the electron density in 60 Torr or more is not shown. The electron density in 40 Torr or less gradually rises from $1 \times 10^{14}/m^3$ to $1.7 \times 10^{14}/m^3$ as pressure rises, and rapidly rises to $8 \times 10^{14}/m^3$ in a range of 40 Torr to 60 Torr. This shows the fact that arc discharge is locally generated with the boundary of pressure of about 40 Torr, and also shows that plasma in a range of 40 Torr to 60 Torr becomes unstable. However, by using this, a plasma with a considerably high density can be obtained.

FIG. 12 shows the electron temperature (Te) and the sustaining voltage. The sustaining voltage necessary for maintaining plasma is a value representative of facility in dealing with plasma, and is desirably as low as possible. In view of this fact, it is preferable that a minimum value is exhibited in a pressure of 10 Torr to 100 Torr and plasma is used in this pressure range. On the other hand, the characteristic curve of the electron temperature has a minimum value in pressure of 60 Torr and a U-shaped form. The electron temperature in an intermediate pressure range of 15 to 100 Torr is lower than that in a lower pressure and a higher pressure than 10 to 100 Torr, that is, 3 eV or less.

The above-mentioned results are typical and therefore do not exhibit all the results. When the used gas is altered to helium, neon or the like, hydrocarbon gas is added to the used gas, or gas flow rate is changed, then the results are different. For example, the minimum pressure of the electron temperature is changed in a range of 60 Torr to 100 Torr, pressure in which the electron density rapidly increases is changed in a range of 40 to 80 Torr, and pressure in which the sustaining voltage is minimum is changed in a range of 20 Torr to 100 Torr. However, substantially the same results are qualitatively obtained.

As a result of the above-description, it is preferable to lower the sustaining voltage in the intermediate pressure (15 Torr to 100 Torr) in view of facility of using the device, lighting of a power supply and lowering of the costs, and it is preferable to increase electron density in view of an increase in radical density. Furthermore, in the range of the intermediate pressure, because the electron temperature is lowered, it is disadvantageous to generation of radical. However, because plasma potential elevates with respect to an anode which is a grounded potential, bombardment of ions to the anode occurs. This is very convenient to fabricate a hard carbon film located on the anode side. The reason will be described below.

Regarding electrons and ions within plasma, electrons readily move under an electric field having the identical strength because of a difference in mass between electrons and ions, compared with ions. Accordingly, the possibility that electrons reach a vessel becomes higher than that of ions. If the vessel is insulative, then the vessel is negatively charged. If the vessel is conductive, assuming that the vessel contacting with plasma is at the same potential as plasma, current flows in a direction of plasma through the vessel. Since flowing of current is contrary to the condition of charge neutrality, plasma potential is changed in a positive direction with respect to the vessel so that flowing of current is canceled. That is, regardless of the vessel being made of a conductive substance or an insulative substance, plasma is positively charged with respect to the vessel according to a difference of mobility between electrons and ions.

This exhibits that an ion sheath exists on the grounded electrode side. It is certain that the ion sheath also exists on the cathode (voltage supply electrode side). However, usually, because an ion sheath which is naturally generated is sufficiently smaller than the sheath generated by self-bias, it is ignored. An electric field generated by the ion sheath can deal with the ion sheath as an equivalent of a capacitor having an electrical double layer.

Assuming that the speed of electrons is Boltzmann-distributed, the electron density within the ion sheath is reduced exponential-functionally so that a space charge within the ion sheath provides an exponential functional curve. It is appropriate that the boundary between the ion sheath and plasma is defined by a position which has a potential of the degree of $Vt=-\kappa \cdot Te/2q$ with respect to bulk potential of plasma. This results from moving the electrons within plasma bulk with energy of the degree of $\kappa \cdot Te/2q$.

As the electron temperature is heightened, a thickness d of the ion sheath is decreased because electrons are infiltrated into the ion sheath, thereby to increase a capacitance C of the electrical double layer. Inversely, as the electron temperature is lowered, the capacitance C of the electrical double layer is reduced.

The charge quantity stored in the ion sheath is proportional to the electron density (Ne), that is, the ion density (Ni), and therefore voltage V developed between both ends of the electrical double layer is represented by the following expression.

$$V = Q/C$$
$$= (Ne)^{2/3} \cdot d / \varepsilon_0 \cdot S$$

where d is the thickness of the ion sheath and S is an area of the electrode. That is, as the electron temperature is lowered, the electric field within the ion sheath is more strengthened, and bombardment of ions to the anode is enlarged.

Hitherto, a hard carbon film could not be fabricated on the anode side. On the other hand, in the device of the present invention, a pressure range is from 15 Torr to 100 Torr. Accordingly, the electron temperature is lowered and bombardment of ions is caused even to the anode, whereby the hard carbon film can be formed even on the anode.

In the coating fabricating apparatus in accordance with the present invention, a film which constitutes an object on which a coating has been fabricated is wound on a part of a second cylindrical electrode which is grounded and opposite to a first electrode. The rotation of the second electrode allows the film to pass between the first and second electrodes. A high-frequency voltage is applied to the first electrode whereby a space between the first and second electrodes produces plasma, and raw gas introduced into plasma is activated, as result of which a film is fabricated. A peripheral edge portion of the first electrode is covered with an insulator so that the first and second electrodes and the insulator constitute a substantially closed space. Gas is supplied into the closed space through pores provided in the first electrode. Plasma is shut out within the closed space so that it is difficult to leak plasma to the exterior. An interval between the first and second electrodes is 6 mm or less, pressure within the closed space is 15 Torr to 100 Torr.

As mentioned above, in addition to setting pressure within the closed space to the intermediate pressure, plasma is enclosed in the closed space, thereby preventing discharge in an undesired region. Further, plasma with higher density is generated so that bombardment of ions to the anode is increased.

The undesired region is actually directed to a peripheral portion of the electrode. In the center of the electrode, an electric field has a given or uniform rate of change. However, in the peripheral portion of the electrode, in particular, edge portions of the voltage supply electrode, an electric field strength is enlarged, and discharge concentrates in that region. That is, impedance is lowered with an increase of the plasma density in that region, whereby a large amount of current flows in that region. Therefore, most of electric power is consumed in the peripheral portion of the electrode so that the plasma density is lowered in the center of the electrode. As a result, the electron density is increased, and bombardment of ions in the center of the electrode is lowered.

In the present invention, in order to solve the above-mentioned problem, the peripheral portion of the voltage supply electrode is covered with an insulator in such a manner that plasma is enclosed in the center of the electrode.

Further, in the coating fabricating apparatus in accordance with the present invention, a film which constitutes an object on which a coating has been fabricated is wound on a part of a second cylindrical electrode which is grounded and opposite to a first electrode. The rotation of the second cylindrical electrode allows the film to pass between the first and second electrodes. A high-frequency voltage is applied to the first electrode in such a manner that a space between the first and second electrodes produces plasma. A raw material introduced in plasma is activated to fabricate a coating. The electrodes are constituted so that the strength of an electric field generated on the first and second electrodes is strongest on the surface of the first electrode but weakest on the surface of the second electrode. The shortest interval between the first and second electrodes is 6 mm or less, and pressure between the first and second electrodes is 15 Torr to 100 Torr.

That is, in addition to setting the pressure to the intermediate pressure, the strength of electric field in the periphery of the first electrode (cathode) is heightened in such a manner that the density of plasma is increased in that region. As the shape of the cathode electrode, a knife-shaped or needle-shaped electrode is effective except that edge portions of the plane is used. The ununiform region of the strength of electric field is positively utilized, thereby to obtain plasma with high density.

Further, in the invention, the first electrode to which a high-frequency voltage is applied and the second cylindrical electrode which is grounded are arranged opposite to each other. Plasma is generated between the first and second electrodes by applying the high-frequency voltage thereto. Raw gas introduced in plasma is activated to fabricate a coating. The second electrode is disposed in such a manner that plasma generated between the first and second electrodes is sprayed on the metal surface of the second electrode which is grounded. An object (film) on which a coating has been fabricated is wound on a part of the second electrode. The rotation of the second electrode allows the film to pass through a region on which plasma has been sprayed. The electrode interval is 6 mm or less, and pressure between the first and second electrodes 15 Torr to 100 Torr.

This is a plasma generating apparatus having a structure of a parallel plate or concentric cylindrical electrode, in which plasma with high density can be generated by setting the intermediate pressure. Plasma is positively sprayed onto the substrate by the aid of a gas stream. Because of the intermediate pressure, gas diffusion is delayed in comparison with low pressure, as a result of which there is a case where radical transport rate is determined. However, this problem is solved by spray of plasma.

Further, in the present invention, gas to be supplied within a plasma space consists of mixture gas of hydrogen and gas selected from hydrocarbon, carbon halide and hydro-carbon halide, or mixture gas of its mixture gas and rare gas.

A high-speed film formation can be realized by setting the intermediate pressure, however, there arises a problem such as adhesion of the film onto the cathode. This can be solved by adding carbon halide thereto.

In the present invention, bombardment of ions onto the anode side is effected thereby being capable of fabricating a hard carbon film even on the anode side. However, since self-bias applied on the cathode side is larger than that on the anode side, bombardment of ions on the cathode side is stronger than that on the anode side. In this embodiment, using this phenomenon, halogen based gas having etching action is added to raw gas whereby no film formation but etching is conducted on the cathode side.

Carbon halide, for example, carbon tetrafluoride is known as etching gas. Carbon tetrafluoride has only etching action, and in dicarbon hexafluoride, tricarbon octafluoride or the like, etching or film formation is performed according to the strength of self-bias. That is, in the case where self-bias is strong and bombardment of ions is also strong, etching is performed. Inversely, in the case where self-bias is weak and bombardment of ions is also weak, the film formation is performed. In the present invention, bombardment is stronger on the cathode side onto which it is not desired to form a film, which is very convenient to the invention.

Accordingly, film fabrication on the cathode side can be restrained and occurrence of flakes can be restrained. Further, the maintenance duration for the apparatus can be extended, thereby greatly contributing to an improvement in through-put and a reduction in the costs. In the case of a super LSI process or the like, it causes contamination, however, in fabricating a carbon film as in the present invention, there does not arise a problem such as contamination. When the film which constitutes an object is electrically conductive, a film can be disposed not on the cathode side but only on the anode side. The present invention is effective even in such a case.

BRIEF DESCRIPTION OF THE DRAWINGS

The accompanying drawings, which are incorporated in and constitute a part of this specification, illustrate embodiments of the invention, and together with the description, serve to explain the objects, advantages and principles of the invention.

In the drawings,

FIG. 1 is a diagram showing a structure of a plasma CVD apparatus for fabricating a hard carbon coating in accordance with an embodiment of the present invention;

DETAILED DESCRIPTION OF THE PREFERRED EMBODIMENTS

Figure 2:
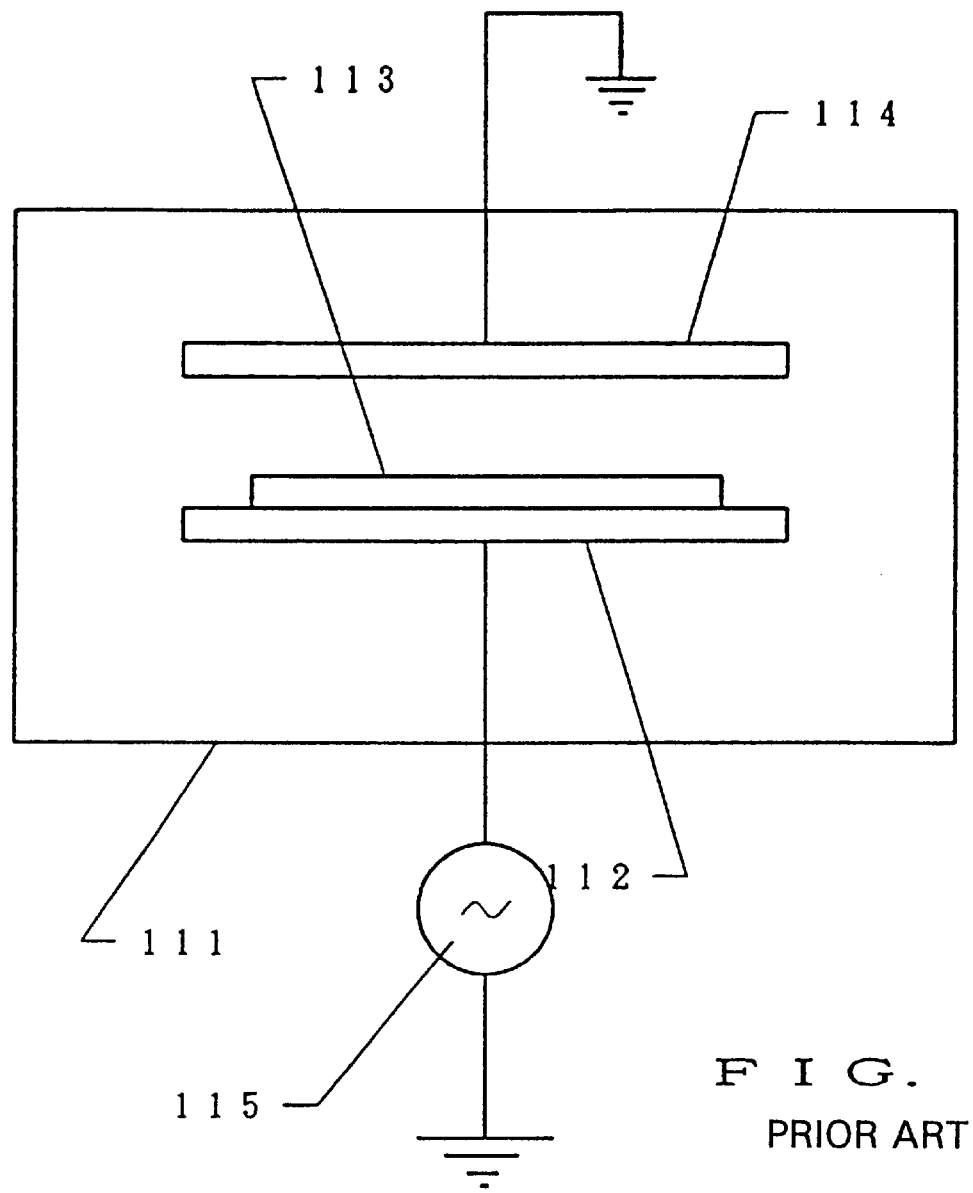
FIG. 2 is a diagram showing a structure of a prior art film forming apparatus.

Embodiments of the present invention will be described in more detail with reference to the accompanying drawings.

First Embodiment

FIG. 1 is a diagram showing a structure of a plasma CVD apparatus for fabricating a hard carbon coating on a surface of an object (substrate) 113. This apparatus performs film formation while the object 113 is ultrasonic vibrated.

The plasma CVD apparatus includes a pair of electrodes 112 and 114 for activating reactive gas (producing plasma) within a vacuum vessel 111. An electrode 114 is grounded, and an electrode 112 is connected to a high-frequency power supply 115, which generates, for example, a high-frequency voltage of 13.56 MHz. In the embodiments according to the present invention, in stead of the high frequency power supply 115, an electromagnetic energy suply for supplying electromagnetic energy can be arranged in the apparatus. In this case, DC, AC (50 Hz to 500 KHz) power supply can be used. Although not shown, a matching unit and the like are disposed therein, and in case of need, a heating device using a heater or an infrared light lamp is provided.

A piezoelectric element 121 interposed between a pair of electrodes 122 and 123 is disposed on the electrode 112, and the object 113 is disposed thereon. The high-frequency voltage is applied from a power supply 125 to the piezoelectric element 121 so that the piezoelectric element 121 vibrates at a predetermined frequency. A frequency ranging, for example, from 1 KHz to 100 MHz is used.

It is necessary to insulate the electrode 123 from the electrode 112. Further, in case of need, the object 113 is mechanically fixed to the electrode 122 with solder material, adhesive material as well as an engaging member (an object fixing member) such as a protrusion or hook.

The piezoelectric element 121 is made of crystal liquid, Rochelle salt, lithium niobate, barium titanate, titanate zirconate (PZP), other organic piezoelectric material, piezoelectric ceramics or the like.

Figure 3:
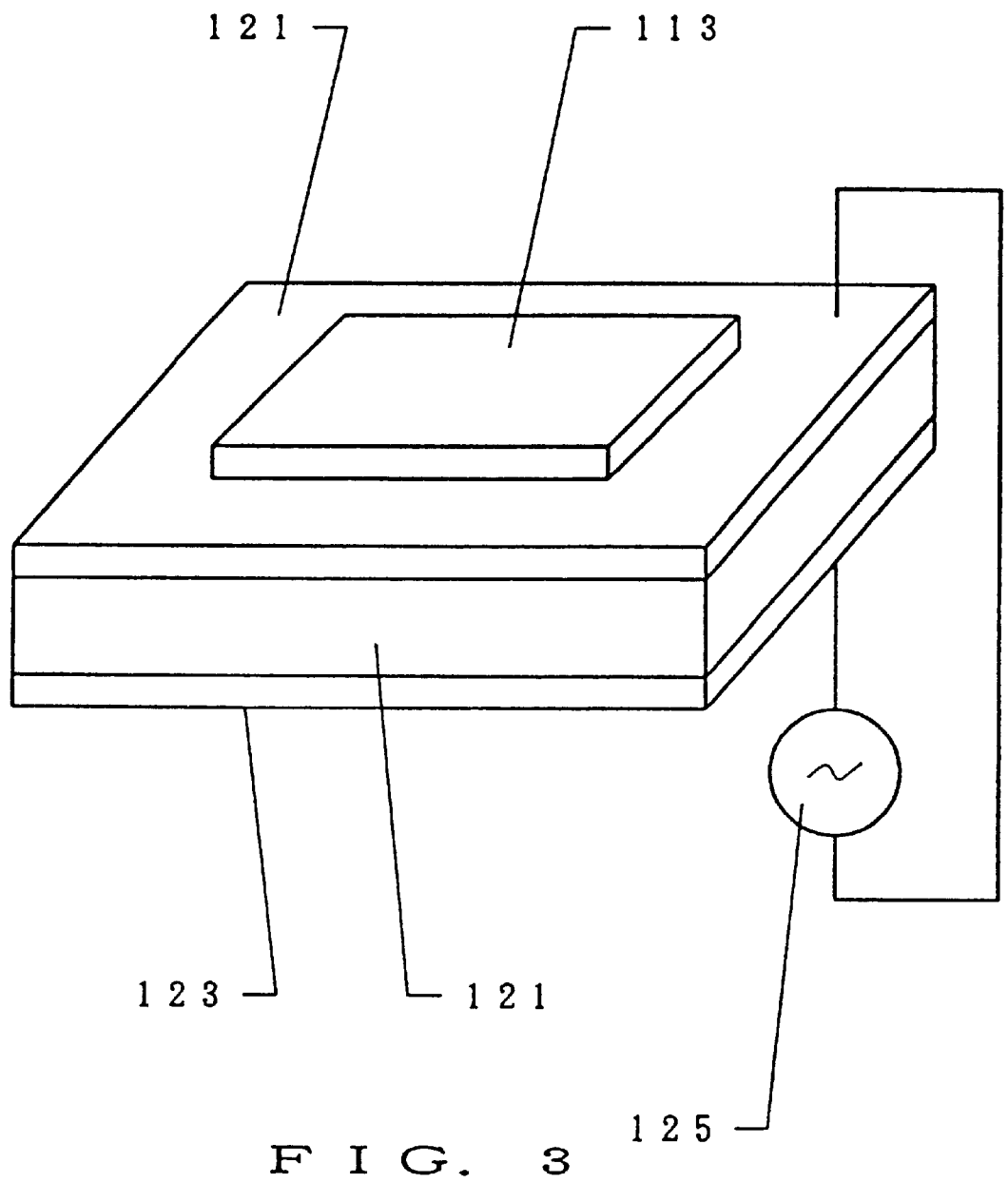
FIG. 3 is a schematic diagram showing a structure of a piezoelectric element in the apparatus shown in FIG. 1.

FIG. 3 is a schematic diagram showing an enlarged portion of the piezoelectric element 121. There are provided the pair of electrodes 122 and 123, the substrate 113 on which a hard carbon coating is formed, and the high-frequency power supply 125 for applying voltage to the piezoelectric element 121. The object 113 vibrates as the piezoelectric element 121 is ultrasonic-vibrated.

The vibrating direction and the vibrating number of the piezoelectric element 121 can be selected in accordance with its cut direction. As the vibrating direction, the thickwise and the face-direction of the piezoelectric element 121 can be selected. Also, sliding vibration and deflection vibration can be set as vibrating modes. A vibrating output is controlled in such a manner that voltage applied to the piezoelectric element 121 is monitored by a monitor such as a voltmeter or the like (not shown).

Further, in the plasma CVD apparatus shown in FIG. 1, it is preferable to make an interval between the pair of electrodes 112 and 114 as narrow as possible. This is a fact obtained from an experimental result. When the electrode interval is 10 mm or less, a film forming speed is increased to thereby obtain a high-quality film. However, since the electrode interval is limited by the thickness of the piezoelectric element 121 and the thickness of the object 113, in fact, it is preferable to set the electrode interval to 20 mm or less.

Hereinafter, conditions where the hard carbon coating is formed on the object 113 will be exhibited. In this case, a silicon substrate is used as the object 113.

Raw gas: ethylene gas+hydrogen gas
Operating pressure: 80 Pa
High-frequency power: 1.5 LW
Object temperature: non-heating The hard carbon coating formed on the object 113 under the above conditions has less peeling from the object 113 and has a fine film quality.

Second Embodiment

Figure 4:
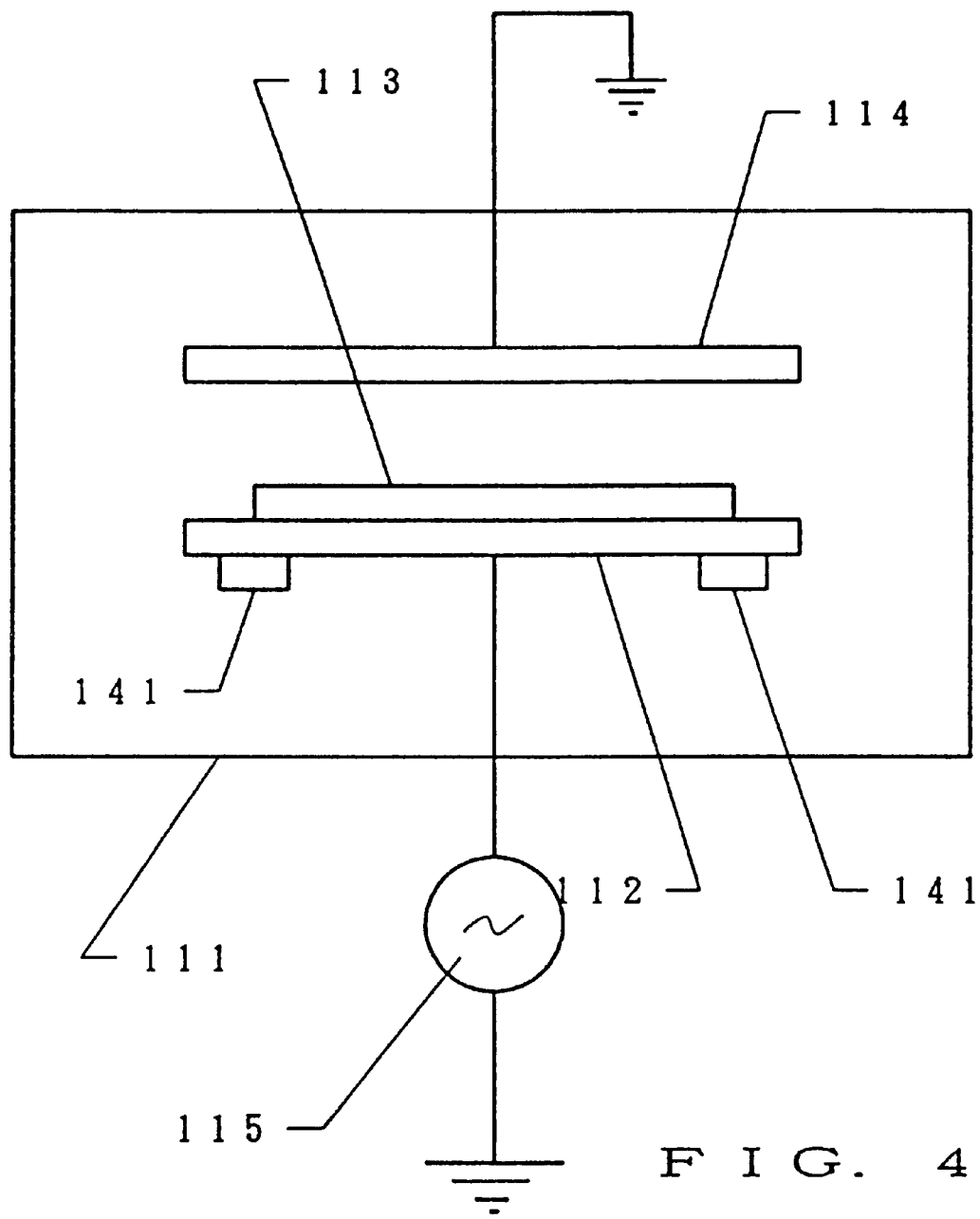
FIG. 4 is a diagram showing a plasma CVD apparatus in accordance with another embodiment of the present invention.

In this embodiment, ultrasonic vibrations are given to the object 113 by a method different from that of the first embodiment. FIG. 4 is a diagram showing a structure of a plasma CVD apparatus in accordance with another embodiment of the present invention. As is apparent from FIG. 4, the electrode 112 is vibrated by a ultrasonic vibrator 141 so that the object 113 is ultrasonic-vibrated. Further, with such a structure, the interval between the pair of electrodes 112 and 114 can be set to 10 mm or less to thereby realize high-speed film formation.

Third Embodiment

Figure 5:
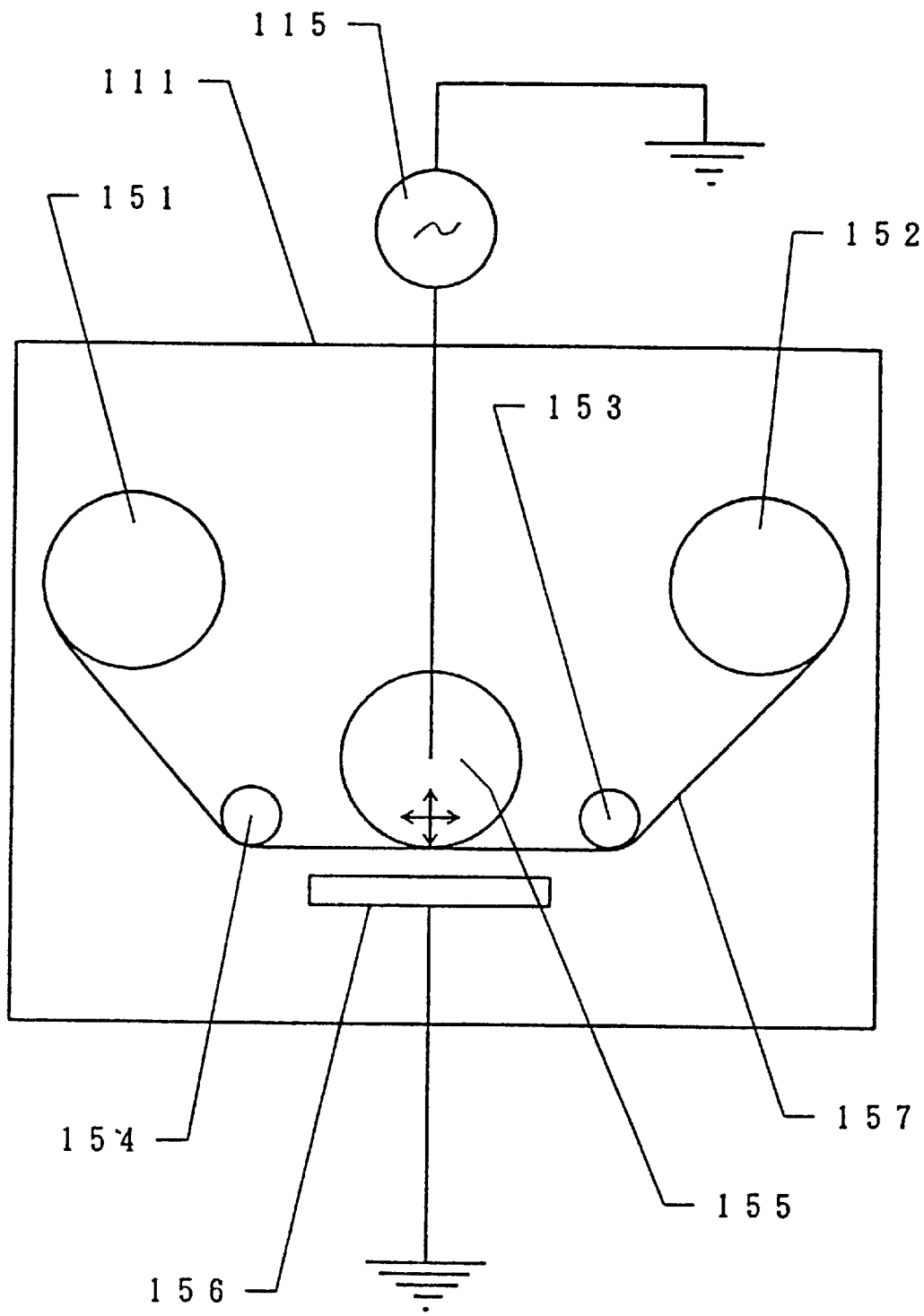
FIG. 5 is a diagram showing a structure of an apparatus for forming a hard carbon coating on a tape-shaped material.

FIG. 5 is a diagram showing a structure of a plasma CVD apparatus for forming a hard carbon coating on a tape-shaped material such as a magnetic tape. The plasma CVD apparatus shown in FIG. 5 includes a vacuum vessel 111, a roll-shaped electrode 155, an electrode 156 paired with the electrode 155, guide rollers 153 and 154 which also act as ultrasonic vibrators, a take-out drum 151 or 152, and a wind-up drum 152 or 151. Although not shown, a gas introducing system and a gas exhausting system for reactive gas, doping gas as well as dilution gas or the like are also provided in the apparatus.

As the tape-shaped object, a band-shaped object formed of a polyimide film is used. The band-shaped film object 157 travels from one drum 151 or 152 to the other drum 152 or 151 while it is taken up. The drum-shaped electrode 155 is connected to a high-frequency power supply 115 of 13.56 MHz so that discharge is generated between the electrode 155 and the electrode 156 which is a grounded electrode. At this time, the electrode 155 rotates in accordance with movement of the object 157. As a result, a hard carbon coating is formed on the surface of the film-shaped object 157.

That is, the respective drums and rollers are rotated in such a manner that the film-shaped substrate travels from one drum to the other drum, and at this time, the hard carbon coating is fabricated on the surface of the film-shaped substrate. Hereinafter, one example of an actual film forming condition will be exhibited. In this case, the substrate travel speed is 50 m/min, and the thickness of the hard carbon coating is 200 Å.

Object: polyimide film having a width of 180 mm
Applied power: 1.5 KW
Film forming pressure: 100 Pa
Electrode interval: 10 mm
Film forming gas: $C_2H_6$ 200 sccm, $H_2$ 50 sccm The film quality of the hard carbon film thus formed is measured in accordance with Raman spectrum. As a result, it is confirmed that it exhibits a feature of a diamond-shaped carbon film and is a high-quality hard carbon coating.

With the above-mentioned structure, ultrasonic vibrations can be given to the film-shaped object 157 from the guide rollers 153 and 154 as face-vibrations. After completion of the film formation, the object 157 is wound up on the drum 151 or 152. A residual of a reactive product which does not form a film remaining on the surface of the object 157 can be removed by ultrasonic vibrations applied from the guide roller 154 or 155.

As a method of giving ultrasonic vibrations onto the object 157, without depending upon the guide rollers 153 and 154, a separate ultrasonic vibrator may be arranged in contact with the substrate 157 to give ultrasonic vibrations thereto. The electrode 155 which is in contact with the object 157 may be vibrated by ultrasonic waves.

In this embodiment, a frequency of 13.56 MHz is used as a high-frequency for generating discharge, however, the invention is not limited to or by this frequency. Also, pulse discharge may be used. As raw gas for the hard carbon coating, hydro-carbon gas such as methane, alcohol or the like may be used. Further, when forming a film, hydrogen, other additive gas or doping gas may be introduced.

Fourth Embodiment

The structure of an apparatus, a film forming condition and the like in this embodiment are the same as in the first embodiment. In this embodiment, a magnetic recording medium such as an optical magnetic disc can be used as the object. In this case, an organic resin plate is used as the object instead of the photo-electro-magnetic disc. As a result, the hard carbon coating formed on the object has less peeling from the object and has a fine film quality.

Fifth Embodiment

In this embodiment, a magnetic recording medium such as an optical magnetic disc is used as the object, and except for using the magnetic recording medium, the structure of a device, a film forming condition and the like in this embodiment are the same as in the second embodiment to thereby realize high-speed film forming.

Sixth Embodiment

The structure of an apparatus, a film forming condition and the like in this embodiment are the same as in the third embodiment. In this case, a belt-shaped object formed of a polyimide film (object material of a magnetic tape) is used as the tape-shaped object.

As a result that the film quality of the hard carbon coating formed is measured by Raman spectrum, it is confirmed that it exhibits the feature of the diamond-shaped carbon film and is of a high-quality hard carbon coating. Also, the hard carbon coating has the number of pin-holes of 30/mm$^2$ or less and is excellent in blocking action against chemical resistance and moisture.

Ultrasonic vibrations generated by the guide rollers 153 and 154 are given to the object 157. As a result, the film-shaped object 157, which is slender in the form of a tape, can be prevented from contracting in a place other than a reactive space (a space defined between the electrodes 155 and 156 where discharge is generated). Further, particles attached to the surface of the substrate 157 can be removed to thereby improve the productivity.

Seventh Embodiment

In this embodiment, in the apparatus shown in FIG. 5, described in the seventh embodiment, the drum-shaped electrode 155 vibrates. In order to ultrasonic-vibrate the electrode 155, the ultrasonic vibrators may be arranged so as to be in contact with the electrode 155.

As indicated by arrows in FIG. 5, there are two cases, that is, one being that the electrode 155 is vibrated in a direction of an inter-electrode, that is, in a direction perpendicular to an object 157 (up and down direction on the figure) and the other being that the electrode 155 is vibrated in a direction perpendicular to the inter-electrode direction, that is, in a direction parallel to the substrate 157 (right and left direction on the figure).

In the case where the electrode 155 is vertically ultrasonic-vibrated, a state in which AC bias is applied thereto can be realized. In the apparatus as shown in FIG. 5, since the electrode 155 connected to the high-frequency power supply 115 is negatively charged with respect to the grounded electrode 156, it comes to a state where negative bias (called "self-bias") is applied thereto. In this state, when the electrode 155 is vertically vibrated, then the object 157 is accelerated so as to approach or go away from ions, which are accelerated in the direction of the electrodes 155, in a given cycle (a cycle determined in accordance with the frequency of ultrasonic vibrations applied to the electrode 155). That is, it comes to a state where AC bias is applied to the electrode 155.

The above-mentioned state is also obtained by giving ultrasonic vibrations to the guide rollers 153 and 154, however, it is more remarkable in the case where ultrasonic vibrations are given to the electrode 155. Accordingly, its effect can be more remarkable in the case where ultrasonic vibrations are given to a flexible object (for example, an object such as a magnetic tape).

Eighth Embodiment

In this embodiment, a surface protective film for an optical magnetic disc as a magnetic recording medium. The optical magnetic disc and an optical disc memory have been widely known as a recording medium such as a CD (compact disc). They are made of organic resin or industrial plastic material and therefore high in productivity and easy in handling. However, a protective film for protecting a surface layer is necessary therefor. The protective film is required to transmit light in a visible light region (in general, a semiconductor laser beam of 700 to 800 nm) and also to provide high hardness and adhesion.

As the protective film satisfying such demands, there is proposed a hard carbon coating formed by the apparatus shown in FIG. 1 or 3. An optical disc may be used for an object. Since the hard carbon coating can be formed without heating, it is optimum as the surface protective film for the optical disc using material weak in heat.

In the above-mentioned embodiment, a frequency of 13.56 MHz is used to generate discharge, however, the invention is not limited to or by this frequency. Also, pulse discharge may be used. Further, in addition to high-frequency discharge, DC or AC bias may be applied thereto.

As raw gas for the hard carbon coating, hydro-carbon gas such as methane, alcohol or the like may be used. Furthermore, when forming a film, hydrogen, other additive gases or doping gas may be introduced.

By fabricating the hard carbon coating while giving ultrasonic vibrations to the object or substrate, a film with fine and excellent qualities can be obtained. In particular, the remarkably fine carbon coating having the number of pin-holes of 30/mm$^2$ or less can be obtained, and therefore significantly useful for the protective film.

Ninth Embodiment

Figure 9:
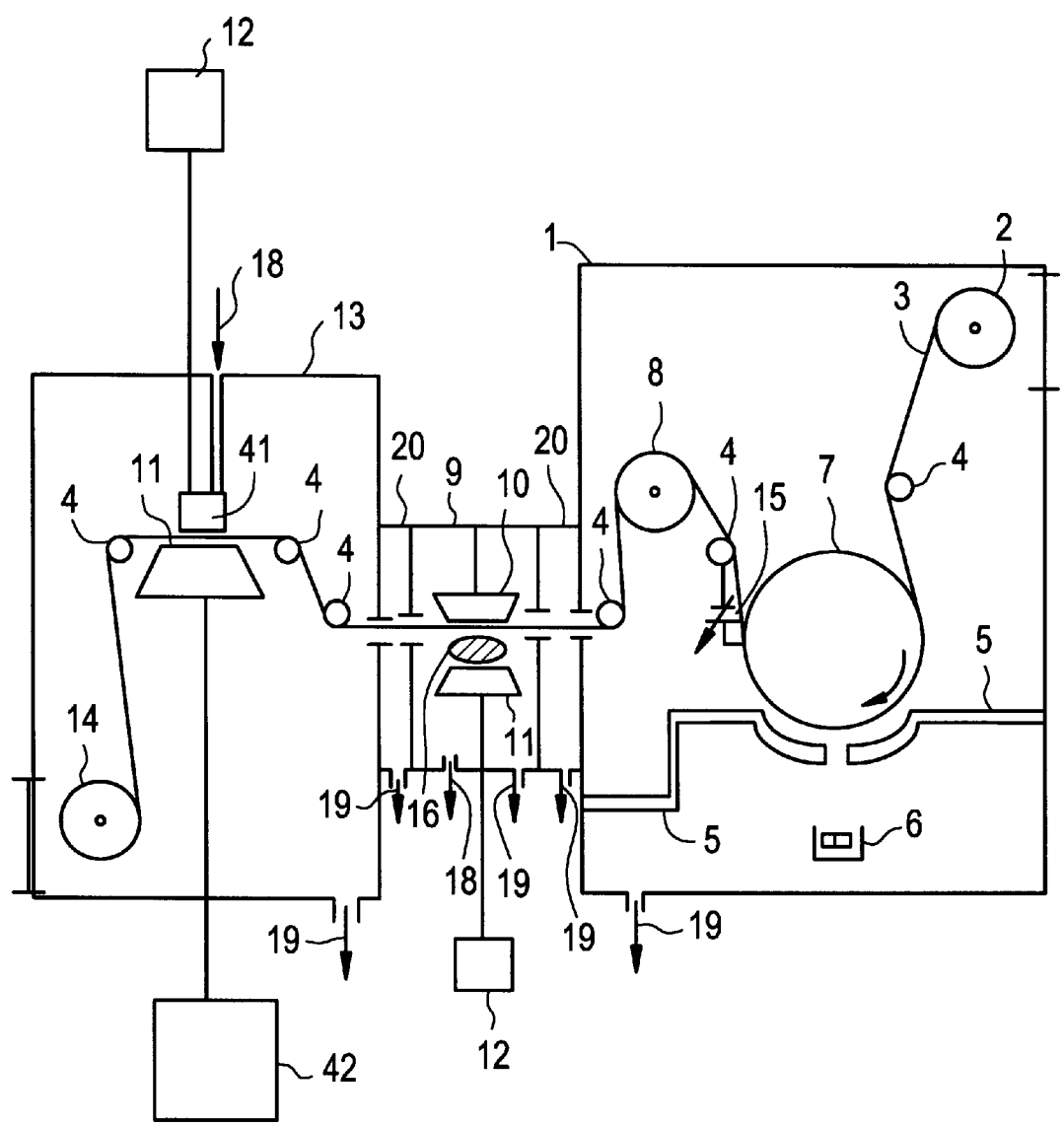
FIG. 9 is a diagram showing a structure of a film forming apparatus in accordance with an embodiment of the present invention.

In FIG. 9, a polymeric substrate material 3 conveyed from a supply roll 2 installed in a vacuum vessel 1 travels through a free roller guide 4 and then along a cylindrical can 7 in a direction indicated by an arrow. A polyimide film having a width of 4 cm and a thickness of 6 μm is used for the polymeric substrate material 3.

Metal atoms evaporated by an evaporating source 6 are deposited on the polymeric substrate material 3 to thereby form a magnetic layer having a thickness of 0.15 to 0.18 μm. A Co—Cr—Ni alloy is used for the evaporated material. In this case, a piercing type electronic gun capable of scanning over a wide range is used, and the magnetic film is formed at accelerating voltage of 35 KV under operating pressure of $5\times10^{-4}$ Torr by the electronic beam deposition method. The passing speed of the polymeric substrate material 3 is set to 135 m/min. A shielding plate 5 is provided for limiting a deposition region.

Potential difference is produced between the cylindrical can 7 and the formed magnetic layer through the free roller guides 4 by a DC power supply 15. Voltage of 80 V is applied so that the polymeric substrate material 3 and the cylindrical can 7 are electrostatically in contact with each other. The polymeric substrate material 3 on which a magnetic layer has been formed is guided to a vacuum vessel 9 through an intermediate roll 8 and then subjected to plasma activating processing therein. The plasma activating processing will be now described.

Hydrogen gas is introduced from a raw gas supply inlet 18 to a space between a grounded electrode 10 and a high-frequency voltage supply electrode 11 which are spaced in parallel to each other at an interval of 3 cm, and exhausted from an exhaust outlet 19 so that the operating pressure is controlled to $10^{-1}$ Torr to $10^{-2}$ Torr. High-frequency voltage of 13.56 MHz is applied from a high-frequency power supply 12 at a power density of 0.5 W/cm$^2$ to thereby generate hydrogen plasma. A plasma region 16 is formed so that the polymeric substrate material 3 passes through the region 16 in synchronization with a magnetic layer forming process.

Through this process, the surface of the magnetic layer is exposed to the activated hydrogen radical or hydrogen ion. As a result, it is properly purified to promote the activation of the surface of the magnetic layer. The same effect is also obtained by using argon gas or mixture gas of argon and hydrogen.

It is preferable that a size of a gap (gap through which polymeric substrate material passes) defined in the partition of buffer chambers 20 in the vacuum vessel 9 is smaller than a Debye distance of plasma produced in the vacuum vessel 9 or a mean free path under pressure of the plasma region 16. This is because plasma is prevented from leaking to the buffer chambers 20.

Subsequently, a vacuum vessel 13 where a coating mainly containing carbon is fabricated will be described. When the polymeric substrate material 3 passes through a region where a plurality of beam-type plasma generating apparatuses are located, a coating mainly containing high-quality carbon is fabricated on the polymeric substrate material 3 on which the magnetic layer guided through the free roller guides 4 has been deposited.

Figure 6:
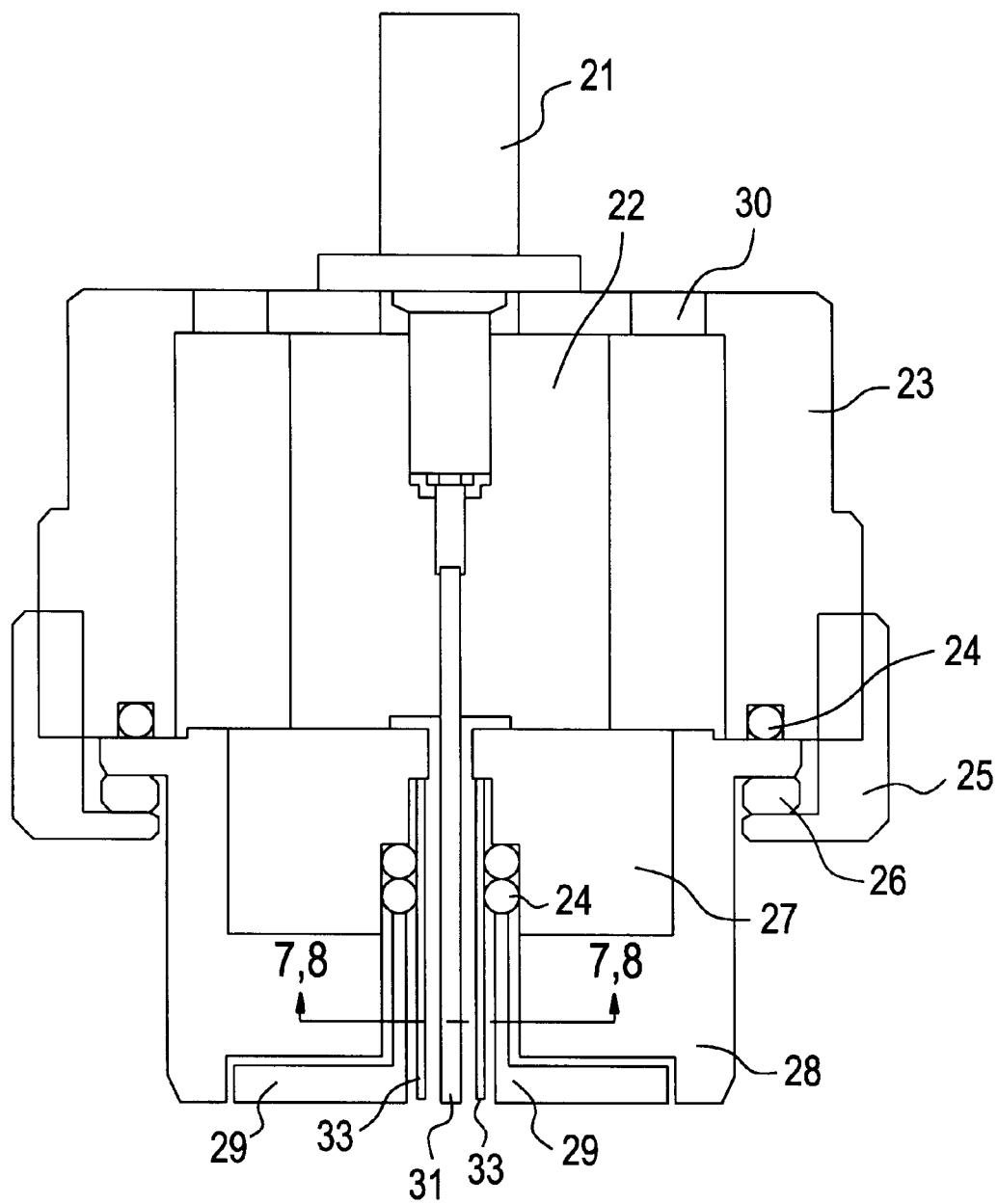
FIG. 6 is a diagram showing a structure of a plasma generating apparatus for generating beam-shaped plasma.

FIG. 6 is a diagram showing a structure of a beam-type plasma generating apparatus for generating beam-type plasma. In the plasma generating apparatus, using gas mainly containing rare gas such as helium or argon, plasma can be generated under pressure which is larger than 1 Torr and less than 200 Torr, preferably 5 to 150 Torr, more preferably 50 to 100 Torr. As rare gas, at least one kind of gas selected from helium, argon, xenon, neon and krypton can be used, or mixture of these rare gases may be used. Not considering the costs, discharge stability is improved when using helium, whereas, considering the costs, argon is advantageous in a low price although it is not excellent in discharge stability in comparison with helium. When using argon, it is desirable that the dielectric constant of an insulator is 9 or more, for example, alumina or the like.

Figure 7:
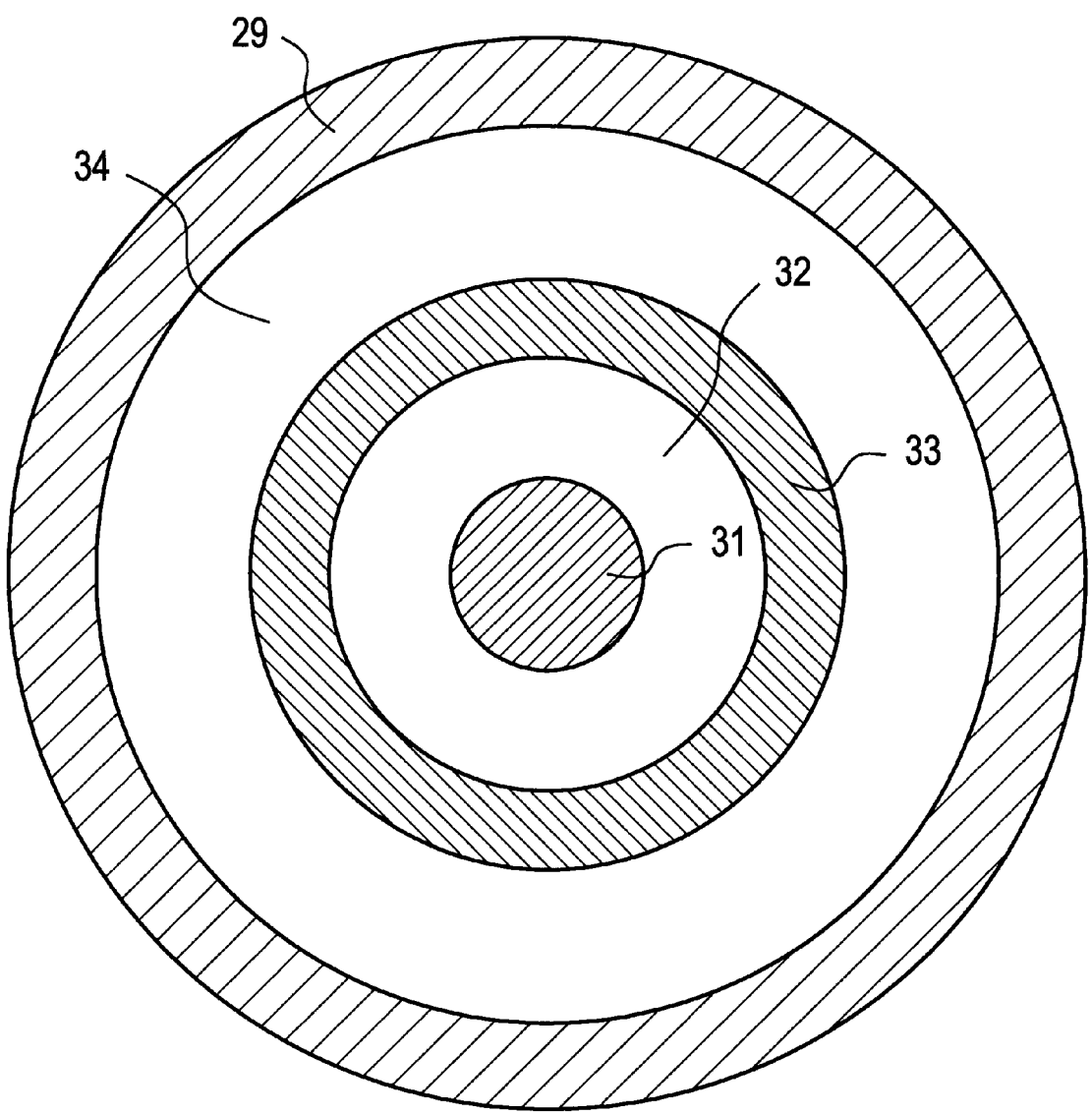
FIG. 7 is a cross-sectional view showing an electrode taken along the line A-A' in FIG. 6.

FIG. 7 shows a cross-section along the lines A-A' shown in FIG. 6. As shown in FIG. 7, a coaxial cylindrical electrode is constituted by an outer conductor 29, a center conductor 31 and a cylindrical insulator 33 so as to generate discharge. In more detail, discharge is generated in a gap 32 between the center conductor 31 and the cylindrical insulator 33. Since gas is not supplied to a gap 34 between the cylindrical insulator 33 and the outer conductor 29, no discharge is generated in this gap 34. The mixture gas (gas mainly containing rare gas) of rare gas and raw gas is plasma-processed in the gap 32 when it passes through the gap 32. As a result, beam-shaped plasma is injected toward the exterior of the apparatus so that a film is formed with activated raw gas.

In this embodiment, the center conductor 31 is made of stainless steel, the cylindrical insulator 33 is made of quartz glass, and the outer conductor 29 is made of stainless steel, respectively. It is desirable to use a material having large dielectric constant as the cylindrical insulator. Also, it is useful to provide irregularities or protrusions on the surface of the center conductor 31 to thereby generate discharge easily.

The center conductor 31 is connected to an MHV coaxial connection closure 21, and the MHV coaxial connection closure 21 is connected to an AC power supply 12 (refer to FIG. 9) through a coaxial cable (not shown). Electromagnetic energy is supplied between the center conductor 31 and the outer conductor 29 by applying AC voltage from the AC power supply 12. Gas mainly containing rare gas (for example, helium) is supplied from a gas introducing inlet 30 and passes between insulators 22 and 27 made of Teflon so as to flow into the gap 32. The Teflon insulators 22 and 27 serve as members for preventing discharge in a region where discharge is unnecessary. Casings 23 and 28 are fixed by fastening tools 25 and 26. The casings 23, 28 and the fastening tools 25, 26 are made of stainless steel, and have grounded potential likewise as in the outer conductor 29.

Rare gas of 80% is desirably contained in gas mainly containing rare gas. This is because rare gas is mainly plasma-processed under pressure of several Torr and more, raw gas is activated by energy of rare gas which has been plasma-processed, and raw gas (for example, methane) is not almost directly activated. Also, unnecessary gas is exhausted from an exhaust outlet 19 (refer to FIG. 9).

O-rings 24 for sealing are provided between the respective members so that gas mainly containing introduced rare gas is prevented from leaking from gaps between the respective members. A conductive metal foil is filled up between the cylindrical insulator 33 and the outer conductor 29. Therefore, no gas flows into the gap between the cylindrical insulator 33 and the outer conductor 29. Gas may flow into the gap.

Figure 10A:
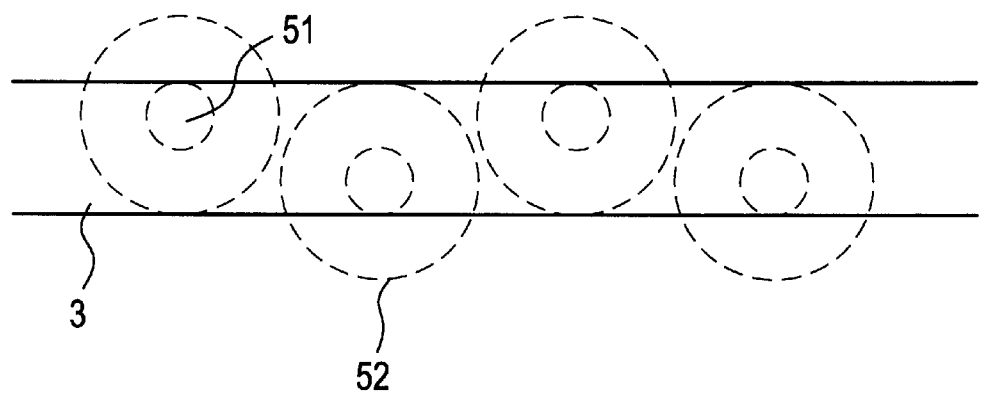
FIGS. 10A and 10B are diagrams of an arrangement of the plasma generating apparatus, respectively.
Figure 10B:
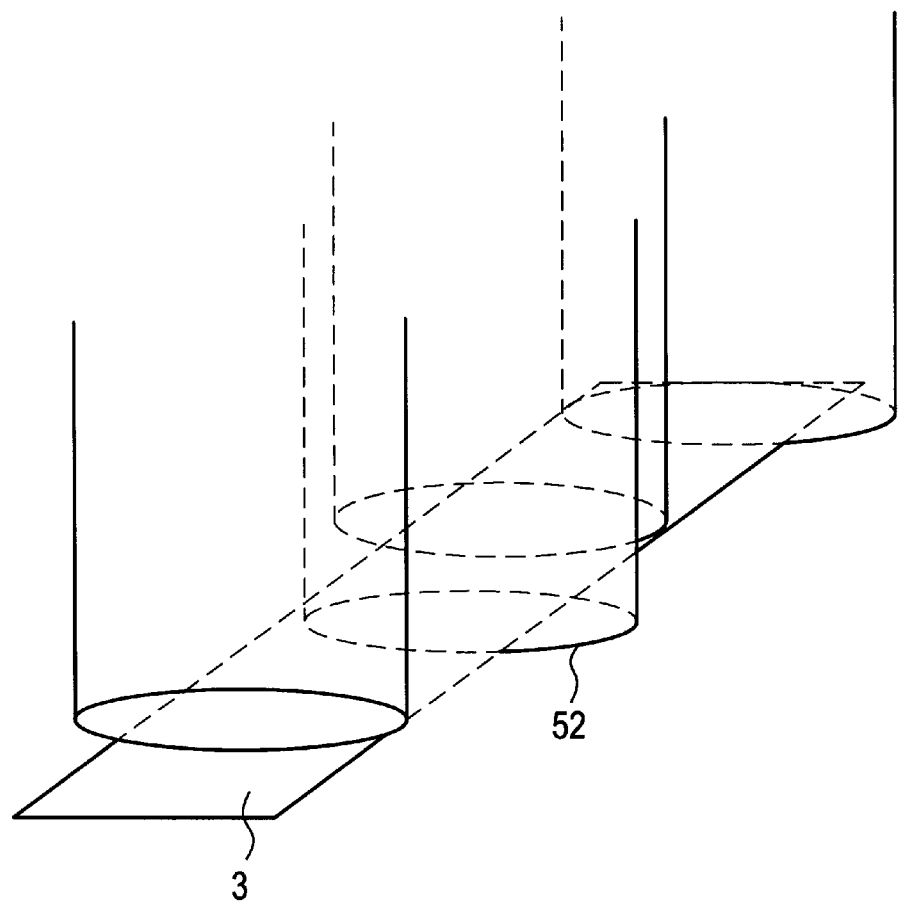

A distance between the polymeric substrate material 3 and the center conductor 31 is 2 mm, a diameter of the center conductor 31 is 5 mm, an outer diameter of the cylindrical insulator 33 is 22 mm, a thickness thereof is 1 mm, and a length of the electrodes is 30 mm. When gas containing helium of 90% is used as rare gas, plasma having a diameter more than 20 mm is generated. As shown in FIGS. 10A and 10B, four plasma generating apparatuses 52 are located so that each apparatus generates plasma 51. As a result, a coating mainly containing carbon can be uniformly formed on the surface of the polymeric substrate material 3 having a width of 40 mm. The four plasma generating apparatuses are installed in a unit 41 shown in FIG. 9 in such a manner that high-frequency power of 13.56 MHz and 500 W is supplied from the power supply 12 to the respective plasma generating apparatuses.

The plasma generating apparatus shown in FIG. 6 generates plasma by discharging between the electrodes constituted in the coaxial form, and the plasma is injected in the form of beams toward the exterior of the apparatus. As mentioned above, discharge is performed with gas mainly containing rare gas. When a coating mainly containing carbon is formed, hydro-carbon gas is added to rare gas as raw gas such as methane or alcohol. Further, in an electrode structure which will be described later, raw gas is specially supplied so as to form a film.

In this embodiment, using helium as rare gas and methane as raw gas, a coating mainly containing carbon can be formed. The film forming condition will be described below.

Applied power: 500 W
Pressure: 100 Torr
Gas:Helium:Methane=100 sccm:10 sccm

Plasma is generated by a low-temperature glow discharge, and its temperature is 100° C. or less. Therefore, an excellent film can be formed even though a substrate is a polymeric substrate material.

Using a bias power supply 42 shown in FIG. 9, DC or AC (high frequency or the like) bias voltage can be applied to a surface on which the coating is to be fabricated. Further, magnetic field is produced on the surface on which the coating is to be fabricated, whereby beam-shaped plasma can be effectively injected on the surface on which the coating is to be fabricated.

The arrangement of the plasma generating apparatus as shown in FIGS. 10A and 10B can be freely set in accordance with a required film forming speed or a size of the surface on which the coating is to be fabricated. For example, if the structure as shown in FIGS. 10A and 10B is additionally provided, i.e., a pair of structure as shown in FIGS. 10A and 10B are arranged, a film forming speed can be twice.

The coating mainly containing carbon is formed at a passing speed cooperating with the above-mentioned two processes, thereby obtaining a film thickness of about 200 Å. The polymeric substrate material 3 on which the film has been formed is restored to a winding-up roll 14 through the free roller guide 4.

In the embodiment of the present invention, in processes before the magnetic layer is formed, irradiation of ions, electrons or the like, or heating or the like can be performed using a known technique if need. Also, in this embodiment, a polyimide film is used as the object, however, metal resin, plastic or the like may be constituted in the form of a roll or plate.

The magnetic recording medium fabricated in this embodiment is cut into a tape having a width of 8 mm and evaluated in reproduced output and durability by using a 8-mm video deck on the market. As a result, when a thickness of the coating mainly containing carbon is 200 Å or more, a stable reproduced output excellent in running stability and still durability and reduced in drop-up is obtained. Further, apart from the normal reproducing operation, even in the continuous and discontinuous test for a special reproducing operation, it is confirmed that excellent durability is exhibited.

Tenth Embodiment

Figure 8:
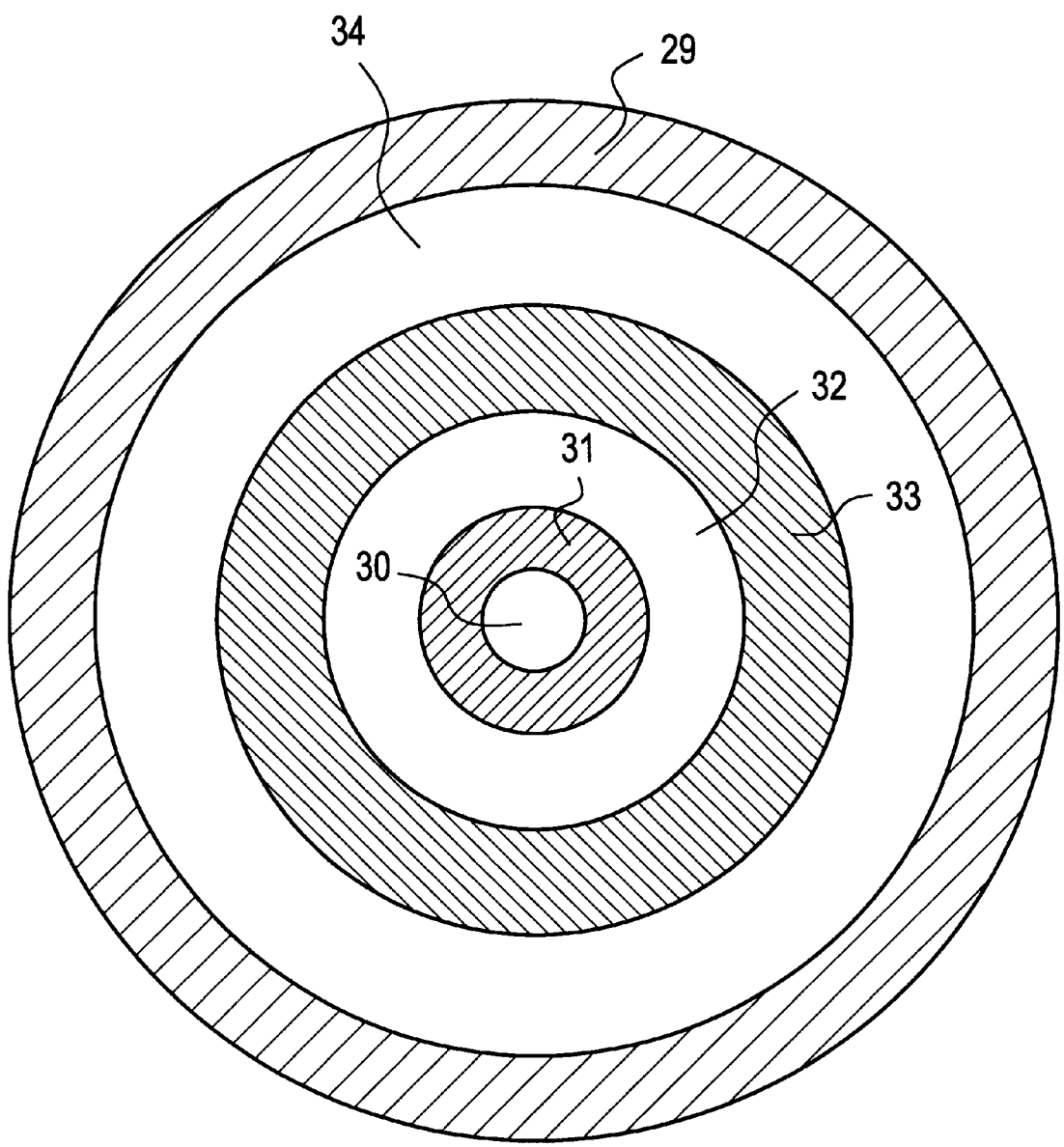
FIG. 8 is a cross-sectional view showing another electrode taken along the line A-A' in FIG. 6.

In this embodiment, in the structure shown in ninth embodiment, reaction products are prevented from adhering to a coaxial discharge electrode portion. A difference in structure between this embodiment and the ninth embodiment is that a hollow portion 30 is provided in the center conductor (center electrode) 31 in such a manner that raw gas flows into the hollow portion 30, as shown in FIG. 8. FIG. 8 shows another cross-section along the line A-A' as shown in FIG. 6.

In such a structure, rare gas (for example, helium) flows into the gap 32, and raw gas (for example, methane) flows into the hollow portion 30. Since discharge is not generated in the hollow portion 30, raw gas is not entirely activated and exhausted to the exterior of the apparatus. On the other hand, rare gas flowing into the gap 32 is plasma-processed by high-frequency discharge generated between the center conductor 31 and the outer conductor 29. The rare gas, which is not activated in the exterior of the apparatus, is coaxially enclosed with the plasma-processed rare gas, and activated or plasma-processed by plasma energy of rare gas.

Since raw gas is activated in the exterior of the apparatus, the possibility that reaction products adhere inside the apparatus and flakes produces can be fundamentally removed. Also, in the exterior of the apparatus, since raw gas is enclosed with the plasma-processed rare gas, its collecting efficiency can be significantly heightened.

Eleventh Embodiment

Figure 11:
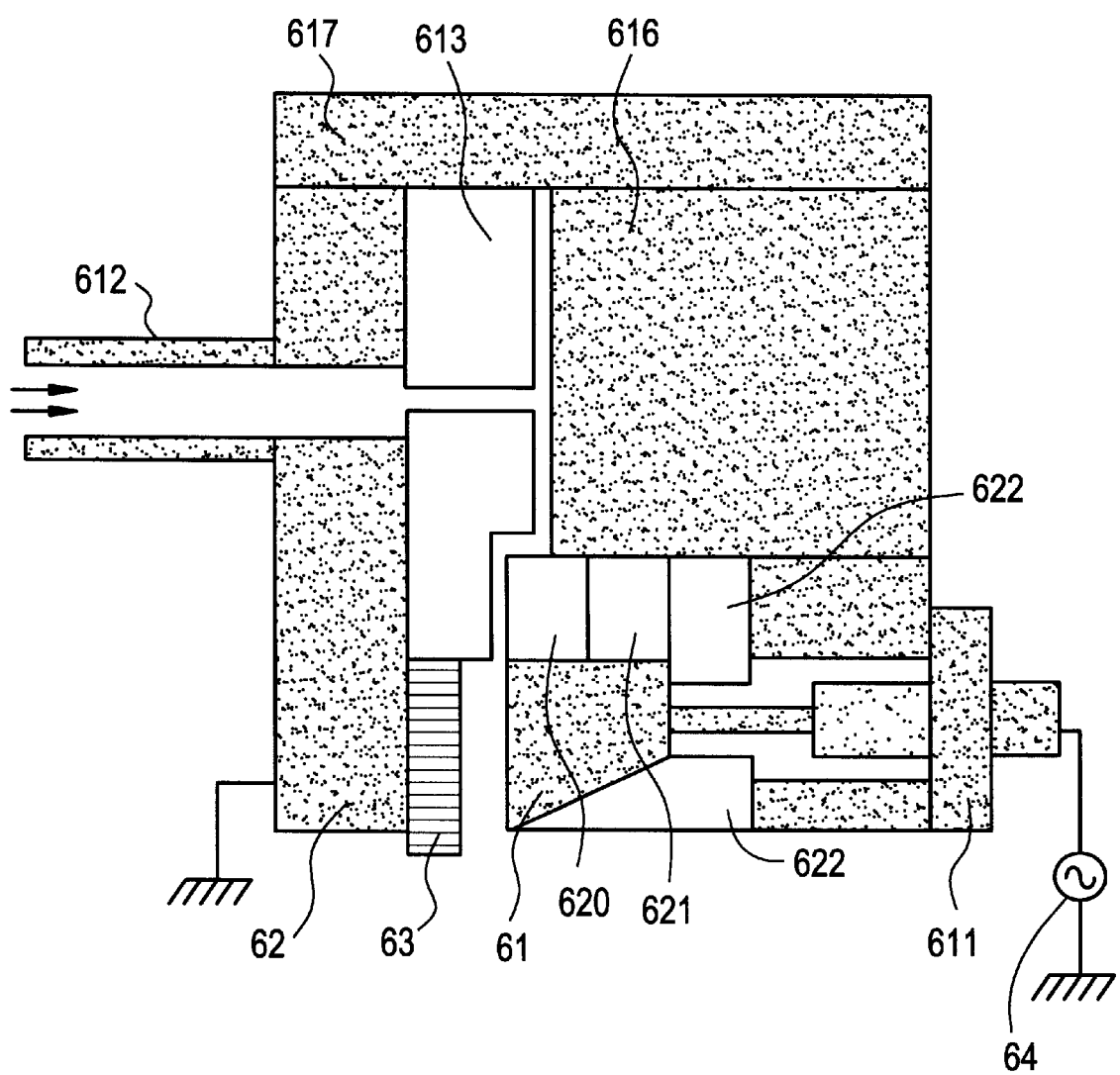
FIG. 11 is a diagram showing a structure of the plasma generating apparatus.
Figure 12:
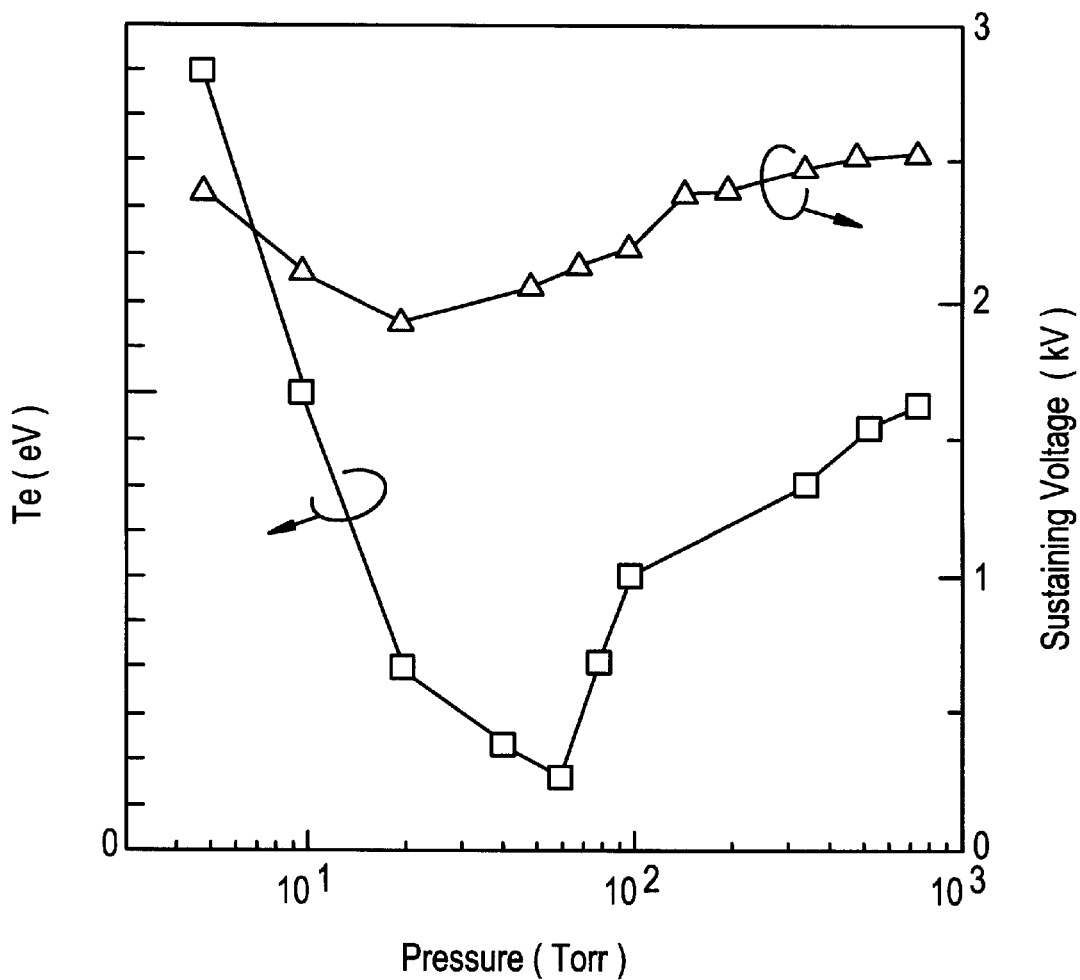
FIG. 12 is a graph showing relationships between pressure and a temperature of electrons and between pressure and a sustaining voltage.

In this embodiment, a sheet-shaped (plate-shaped) plasma generating apparatus is used as the plasma generating apparatuses disposed in the unit 41 as shown in FIG. 9. The structure of this sheet-shaped plasma generating apparatus is shown in FIG. 11. The apparatus has a parallel plate electrode. Plasma generated by the parallel plate electrode is discharged to the exterior of the apparatus as plate-shaped plasma.

In FIG. 11, a parallel plate electrode includes an electrode plate 61, an insulator plate 63 and an outer casing 62. The insulator plate 63 is provided in close contact with the outer casing 62. In this embodiment, the electrode plate 61 is made of stainless steel, the insulator plate 63 is made of quartz glass, and the outer casing 62 is made of stainless steel. The electrode plate 61 is insulated from other members with Teflon shields 620, 621 and 622 and connected to the MHV coaxial connection closure 611. An AC power supply 64 (corresponding to the bias power supply 42) having a frequency of 13.56 MHz supplies AC voltage to the electrode plate 61 through a coaxial cable (not shown) connected to the MHV coaxial connection closure 611.

Rare gas supplied to a space between the electrode plate 61 and the insulator plate 63 is introduced from a gas introducing inlet 612 and passes through a gas groove carved on an insulator 613 made of Teflon. The Teflon insulator 613 also serves as a member for preventing discharge on a place where no discharge is necessary. The outer casing 62 and an electrode plate holder 616 are fixed on a roof 617. The electrode plate holder 616 and the roof 617 are made of stainless steel, and they as well as the outer casing 62 have grounded potential. A width of the insulator plate 63, that is, a discharge portion width (in FIG. 11, a length of the electrode in the depth direction) is 25 mm, and a thickness of the insulator plate is 1.0 mm. Also, an electrode interval is 5 mm, an electrode length (in FIG. 11, a length in the longitudinal direction) is 30 mm. Therefore, sheet-type plasma of about 5 mm×25 mm is generated.

Helium of 100 sccm is supplied to the above-mentioned apparatus, and high-frequency power of 500 W (frequency of 13.56 MHz) is supplied thereto under pressure of 100

Torr. In this case, stable discharge is obtained in a discharge region so that sheet-shaped plasma can be discharged to the exterior of the aparatus. Even though this state is maintained for ten minutes or more, no trouble such as overheating is caused.

As a result of measuring a temperature of plasma formed by discharging with a thermocouple, a temperature of approximately a room temperature to 70° C. is obtained, and therefore it is confirmed that low-temperature glow discharge is generated.

When this embodiment is applied to the structure shown in FIG. 9, it is preferable to use raw gas such as methane or ethylene as additive gas. Also, when a film forming speed is increased or a film forming area is enlarged, a plurality of plasma generating apparatuses may be arranged as shown in FIGS. 10A and 10B.

Twelfth Embodiment

Figure 13:
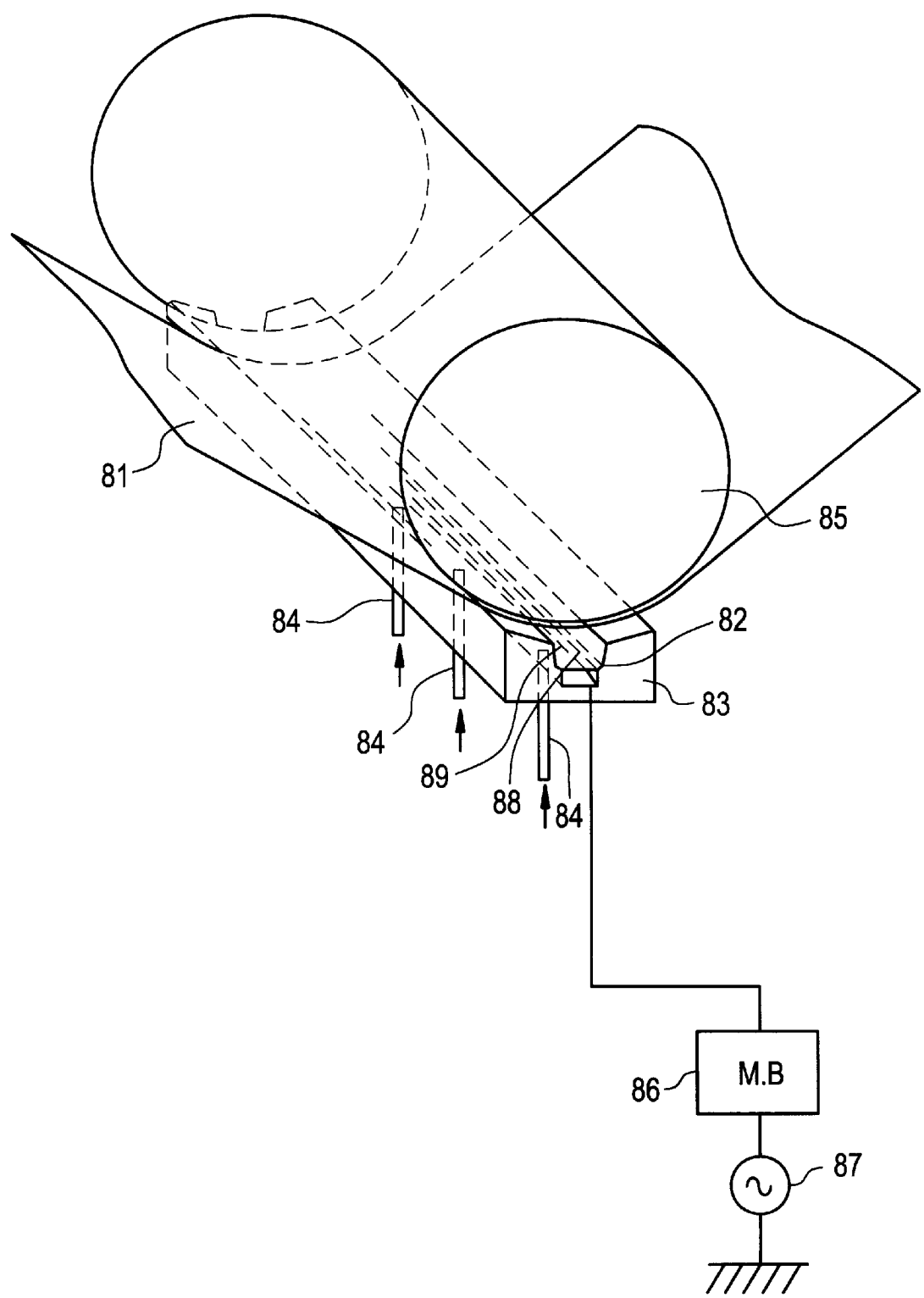
FIG. 13 is a cross-sectional view showing the plasma generating apparatus.
Figure 14:
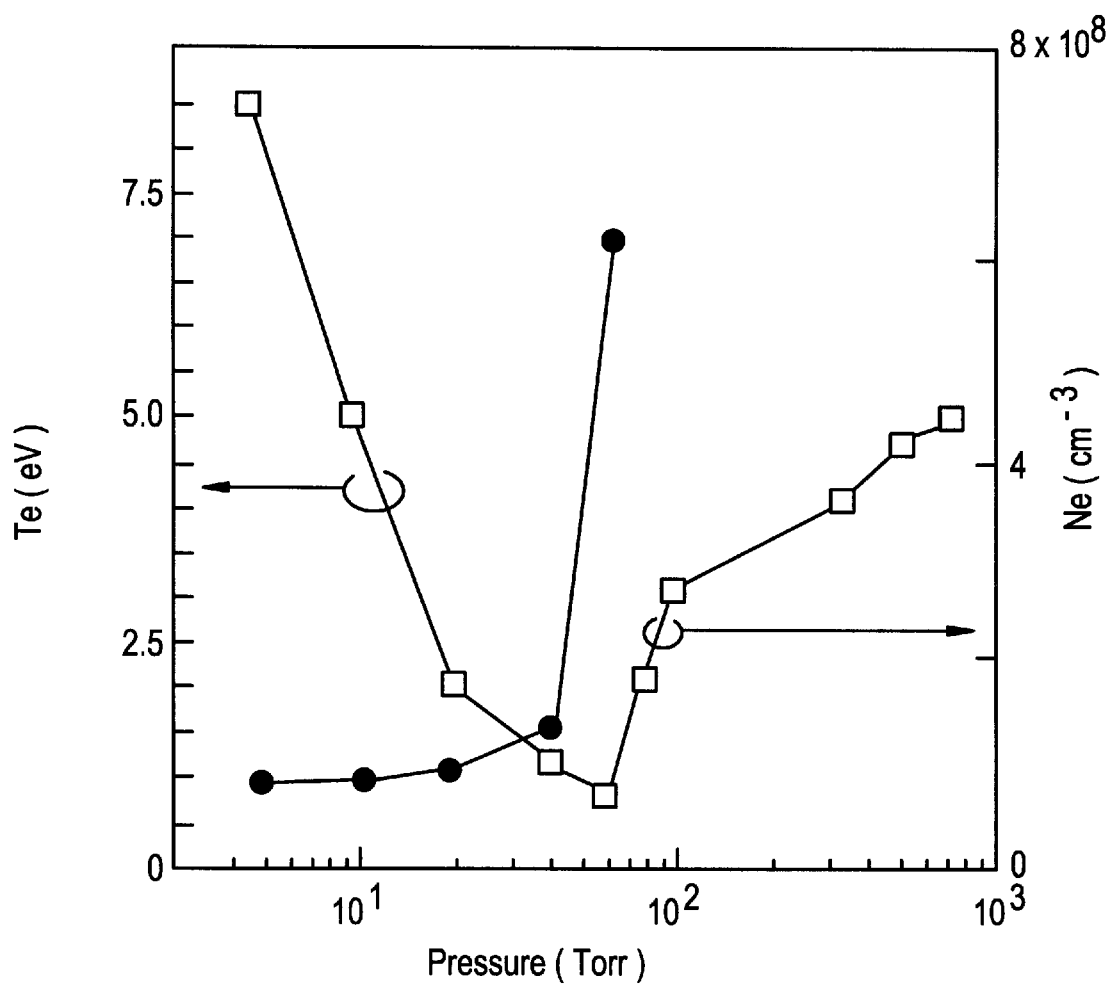
FIG. 14 is a graph showing relationships between pressure and a temperature of electrons and between pressure and a density of electrons.

In this embodiment, the unit 41 shown in FIG. 9 is constituted as shown in FIG. 13. In FIG. 13, as the film-shaped object (substrate) 81, for example, a magnetic recording medium tape is used. A cathode electrode 82 is supported by an insulator 83 and connected to a high-frequency power supply 87 through a matching box 86. A cylindrical electrode 85 used as an anode electrode is grounded. High-frequency discharge is generated in a plasma reaction space 89 between the anode electrode 85 and the cathode electrode 82. The anode electrode 85 can be rotated whereby the film-shaped object 81 is smoothly moved. Raw gas, rare gas, and additive gas are guided into the plasma discharge space 89 through a gas introducing pipe 84. These gases are guided from the gas introducing pipe 84 to fine holes 88 provided in the anode electrode 82 and injected into the plasma reaction space.

A width of the cathode electrode 82 (a width effective in discharge) is 20 mm, and a length thereof is 30 cm. Also, a diameter of the cylindrical anode electrode 85 is 20 mm, and a length thereof is 30 mm. An interval between the cathode electrode 82 and the anode electrode 85 is 5 mm. An interval of the paired electrodes is desirably 10 mm or less.

An organic resin film having a width of 10 inches on which a metal magnetic substance has been deposited is used as a film-shaped object 81, and a hard carbon coating having a thickness of 300 Å is formed on the surface of that film. The film-shaped object travels at 12 m/min (20 cm/sec). In this case, the film-shaped object travels in the discharge space 89 having a width of 20 mm for 0.1 seconds. Therefore, in order to form a film having a thickness of 300 Å, a film forming speed of 3000 Å/sec is necessary. Hereinafter, the conditions under which the film forming speed of 3000 Å/sec is obtained will be exhibited.

Reaction pressure: 60 Torr
Applied power: 300 W (5 W/cm$^2$) (13.56 MHz)
Raw gas: $C_2H_4:H_2:Ar=1:1:2$ (1000 sccm in total)
Additive gas: $C_2F_6$ (addition of 10% to $C_2H_4$)

The film forming speed of 3000 Å/sec can be obtained under the above-mentioned conditions, whereby the hard carbon film having a thickness of 300 Å can be formed on the surface of the film-shaped object 81.

$C_2F_6$ is used as additive gas for the following reason. That is, in general, when the film is formed at the above-mentioned speed, a large amount of reaction products adhere to the cathode electrode. The reaction products come to flakes, resulting in an obstacle to the film formation. Therefore, an arrangement in which no reaction products adhere to the cathode electrode is required.

On the other hand, in the structure shown in FIG. 13, the cathode electrode 82 is biased at minus potential by action of self-bias, and plus ions produced by plasma discharge is attracted to the cathode electrode 82 side. As a result, the cathode electrode 82 side is spattered.

When $C_2F_6$ is used as additive gas as in this embodiment, since the cathode electrode 82 side is spattered and etched, the reaction products adhering to the cathode electrode 82 are etched simultaneously when adhering. Therefore, the hard carbon film can be formed without adhering the reaction products to the cathode electrode.

$C_2F_6$ is used because $C_2F_6$ has etching action of F and hard carbon film forming action of C. $CF_4$ can be used as additive gas. However, since $CF_4$ has no hard carbon film forming action, it is desirable to use $C_2F_6$ which contributes to the hard carbon film formation.

Thirteenth Embodiment

Figure 15:
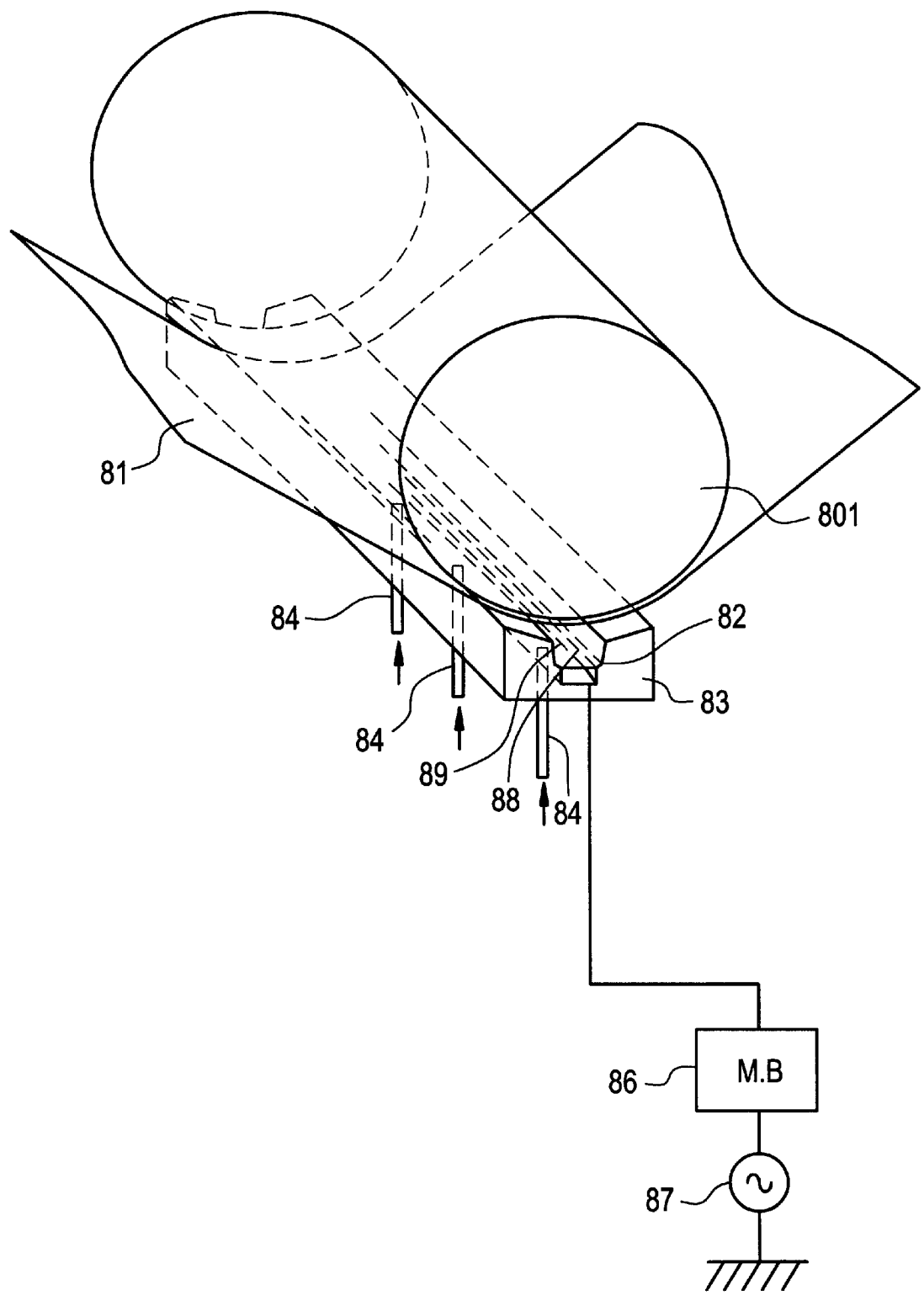
FIG. 15 is a cross-sectional view showing another plasma generating apparatus.

FIG. 15 is a diagram showing an apparatus for fabricating a coating on the surface of a tape- or film- shaped object. In this embodiment, in particular, a case where the carbon coating is fabricated on the surface of the magnetic tape as the surface protective film will be described.

In the film-shaped object 81, a film made of magnetic material is formed on the surface of resin material such as polyimide or the like by the vapor deposition method, and the like. The cathode electrode 82 is connected to the high-frequency power supply 87 through the matching box 86. A can roll 801 constituting an anode electrode rotates during film formation in order to convey the substrate 81. The electrode 801 is constituted so that it is ultrasonic-vibrated by piezoelectric elements. That is, ultrasonic-vibrations are given to the object 81 by the cylindrical electrode 801 during film formation so that the object 81 is ultrasonic-vibrated.

In the film formation, high-frequency discharge is generated in the plasma reaction space 89 between the anode electrode 801 and the cathode electrode 82. From a gas introducing pipe 84, methane of raw gas and dilution gas such as hydrogen are introduced into the plasma reaction space 89. The gases blow off from the fine holes 88 provided in the cathode electrode 82 into the reaction space 89.

The width of the cathode electrode is set to, for example, 20 mm, and a length thereof is set to, for example, 30 cm. A diameter of the cylindrical anode electrode 801 is set to, for example, 20 mm, a length thereof is set to, for example, 30 cm or less. In this case, the substrate 81 having a width of 30 cm or less can be used.

An example of the film forming conditions in the case where the electrode having the above-mentioned dimensions is used.

Reaction pressure: 60 Torr
Applied power: 300 W (13.56 MHz)
Raw gas: $C_2H_4:H_2:Ar=1:1:2$ (1000 sccm in total)
Additive gas: $C_2F_6$ (addition of 10% to $C_2H_4$)
Ultrasonic frequency: 30 KHz (Ultrasonic vibrations given to electrode 801)

The ultrasonic vibrations are given to the object 81 through the electrode 801, whereby restraining the flakes of the reaction products from adhering to the surface of the substrate 81 on which a coating is to be fabricated. As a result, a fine carbon coating without pin-holes can be fabricated.

As described above, by etching the cathode electrode with halogen gas, the film can be formed on the surface of the film-shaped object on the anode electrode side without adhering the reaction products to the cathode electrode.

The present invention can provide an apparatus for fabricating a hard carbon film with stability and high reliability on the surface of the magnetic recording medium having the conductive metal magnetic layer.

Further, although a carbon film with sufficiently high hardness could not be fabricated on the grounded electrode side in the conventional apparatus, the present invention can provide an apparatus capable of fabricating the carbon film having sufficient wear resistance and lubricity even in a state where it is in contact with the anode which is a grounded electrode.

Furthermore, the present invention can provide an apparatus for forming a film at a high speed capable of fabricating the hard carbon film as a protective film at the same time of the magnetic layer fabricating process.

Further, the present invention can provide an apparatus for restraining occurrence of flakes caused by dirts on the electrodes produced by the high-speed film formation. As a result, the film formation on the cathode side can be restrained so that occurrence of the flakes can be restrained. Moreover, since the maintenance period of the apparatus can be extended, through-put can be improved, thereby greatly contributing to reduction in the costs.

Further, the magnetic recording medium fabricated by the fabricating apparatus of the present invention has a high quality which is improved in adhesion and surface characteristics between the medium and the coating mainly containing the magnetic layer and carbon. Furthermore, although a low-grade oxide fabricated on the surface of the magnetic layer may not be fundamentally removed only by preventing it from being exposed from the atmosphere, in that case, the plasma activating process in accordance with the present invention is effective in removal of the oxide. Further, the surface characteristics of the coating mainly containing carbon, that is, wear resistance, high smoothing property, hardness and the like are remarkably improved, thereby enabling the manufacture of the magnetic recording medium which is sufficiently worthy in industry, and the rate-determining point on continuous fabrication which was a problem in the conventional apparatus can be also prevented.

The foregoing description of preferred embodiments of the invention has been presented for the purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for fabricating a carbon coating or a coating mainly containing carbon comprising the steps of:
    forming the carbon coating or the coating mainly containing carbon on a substrate by using plasma while said substrate is ultrasonic-vibrated,
    wherein said carbon coating or said coating mainly containing carbon includes pin-holes, and the number of said pin-holes is 30/mm² or less.

2. The method as claimed in claim 1 wherein a high-frequency voltage is used to generate said plasma.

3. The method as claimed in claim 1 wherein an electromagnetic energy is used to generate said plasma.

4. The method as claimed in claim 3 wherein DC or AC power is used as said electromagnetic energy.

5. The method as claimed in claim 1 wherein said substrate is ultrasonic-vibrated by piezoelectric element using a frequency of 1 KHz to 100 MHz.

6. The method of claim 1 wherein said carbon coating or said coating mainly containing carbon comprises a diamond-like carbon.

7. A method for fabricating a carbon coating or a coating mainly containing carbon comprising the steps of:
    disposing a substrate on one of a pair of electrodes which interpose a piezoelectric element therebetween and are connected with a power supply for applying a voltage to said piezoelectric element through said pair of electrodes therefrom;
    applying a high-frequency voltage to one of a pair of plasma electrodes which is provided under said one of the pair of electrodes interposing the piezoelectric element therebetween; and
    introducing a reactive gas between said pair of plasma electrodes with the other of said pair of plasma electrodes being grounded to form the carbon coating or the coating mainly containing carbon on said substrate while said substrate is ultrasonic-vibrated.

8. The method as claimed in claim 7 wherein said substrate is ultrasonic-vibrated by piezoelectric element using a frequency of 1 KHz to 100 MHz.

9. The method of claim 7 wherein said carbon coating or said coating mainly containing carbon comprises a diamond-like carbon.

10. A method for fabricating a carbon coating or a coating mainly containing carbon comprising the steps of:
    moving a film-shaped object between a grounded electrode and an electrode connected with a high-frequency power supply from a take-out drum to a wind-up drum through at least two guide rollers, said electrode connected with a high-frequency power supply being provided between said two guide rollers;
    giving ultrasonic vibrations to said film-shaped object from said two guide rollers; and
    introducing a reactive gas between said grounded electrode and said electrode connected with a high-frequency power supply to form the carbon coating or the coating mainly containing carbon on said film-shaped object by plasma generated between said grounded electrode and said electrode connected with a high-frequency power supply.

11. The method as claimed in claim 10 wherein a high-frequency voltage is used to generate said plasma.

12. The method as claimed in claim 10 wherein an electromagnetic energy is used to generate said plasma.

13. The method as claimed in claim 12 wherein DC or AC power is used as said electromagnetic energy.

14. The method of claim 10 wherein said carbon coating or said coating mainly containing carbon comprises a diamond-like carbon.

15. A method for fabricating a carbon coating or a coating mainly containing carbon comprising the steps of:
    forming the carbon coating or the coating mainly containing carbon on a substrate by discharge generated between a pair of electrodes while said substrate is ultrasonic-vibrated by ultrasonic-vibrating at least two auxiliary rollers provided in contact with said substrate and with said pair of electrodes being provided between said two auxiliary rollers.

16. The method as claimed in claim 15 wherein said substrate is ultrasonic-vibrated in a direction perpendicular to said pair of electrodes.

17. The method of claim 15 wherein said carbon coating or said coating mainly containing carbon comprises a diamond-like carbon. ultrasonic-vibrated in a direction perpendicular to said pair of electrodes.

18. A method for fabricating a carbon coating or a coating mainly containing carbon comprising the steps of:

forming the carbon coating or the coating mainly containing carbon on a substrate by discharge generated between a grounded electrode and an electrode connected to a high frequency power supply while disposing said substrate on said electrode connected to the high frequency power supply and while ultrasonic-vibrating said substrate by ultrasonic-vibrating said electrode connected to the high frequency power supply.

19. The method as claimed in claim 18 wherein said substrate is ultrasonic-vibrated in a direction perpendicular to said grounded electrode.

20. The method of claim 18 wherein said carbon coating or said coating mainly containing carbon comprises a diamond-like carbon.

21. A method of fabricating a carbon coating on a surface of an object, comprising the steps of:

locating the object on a side of an electrode connected to a power supply;

supplying ultrasonic vibrations to the object; and generating discharge between the electrode connected to the power supply and an electrode which is grounded, to fabricate the carbon coating on the surface of the object.

22. The method as claimed in claim 21, wherein the object includes a film-shaped material.

23. The method as claimed in claim 22, wherein the object passes between the electrode connected to the power supply and the electrode grounded thereby a carbon coating is fabricated on the surface of the object.

24. The method of claim 21 wherein said carbon coating comprises a diamond-like carbon.

25. A method of fabricating a carbon coating on a surface of a magnetic recording medium, comprising the steps of:

locating the magnetic recording medium on a side of an electrode connected to a power supply;

supplying ultrasonic vibrations to the magnetic recording medium; and generating discharge between the electrode connected to the power supply and an electrode which is grounded, to fabricate the carbon coating on the surface of the magnetic recording medium.

26. The method as claimed in claim 25, wherein the carbon coating includes pin-holes and the number of said pin-holes is $30/mm^2$ or less.

27. The method as claimed in claim 25, wherein the magnetic recording medium includes a film-shaped material.

28. The method as claimed in claim 26, wherein the magnetic recording medium passes between the electrode connected to the power supply and the electrode grounded thereby a carbon coating is fabricated on the surface of the magnetic recording medium.

29. A method of fabricating a protective film for a magnetic recording medium, comprising the steps of:

supplying ultrasonic vibrations to a tape-shaped object on a place except for a space between a pair of electrodes, to remove particles adhering to a surface of the tape-shaped object; and fabricating a carbon coating on the surface of the tape-shaped object while the tape-shaped object passes between the electrodes, wherein the fabricated carbon coating includes pin-holes, and the number of said pin-holes is $30/mm^2$ or less.

30. The method of claim 29 wherein said carbon coating comprises a diamond-like carbon.

31. A method of fabricating a carbon coating or a coating mainly containing carbon, comprising the steps of:

moving a film-shaped object between a grounded electrode and an electrode connected with a high-frequency power supply from a take-out drum to a wind-up drum;

giving ultrasonic vibrations to said film-shaped object from said electrode connected with a high-frequency power supply; and introducing a reactive gas between said grounded electrode and said electrode connected with a high-frequency power supply to form the carbon coating or the coating mainly containing carbon on said film-shaped object by plasma generated between said grounded electrode and said electrode connected with a high-frequency power supply.

32. The method of claim 31 wherein said carbon coating or said coating mainly containing carbon comprises a diamond-like carbon.

33. A method of fabricating a carbon coating or a coating mainly containing carbon, comprising the steps of:

moving a film-shaped object between a grounded electrode and an electrode connected with a high-frequency power supply from a take-out drum to a wind-up drum;

giving ultrasonic vibrations to said film-shaped object in a direction perpendicular to said film-shaped object from said electrode connected with a high-frequency power supply; and introducing a reactive gas between said grounded electrode and said electrode connected with a high-frequency power supply to form the carbon coating or the coating mainly containing carbon on said film-shaped object by plasma generated between said grounded electrode and said electrode connected with a high-frequency power supply.

34. The method of claim 33 wherein said carbon coating or said coating mainly containing carbon comprises a diamond-like carbon.

35. A method of fabricating a carbon coating or a coating mainly containing carbon, comprising the steps of:

moving a film-shaped object between a grounded electrode and an electrode connected with a high-frequency power supply from a take-out drum to a wind-up drum;

giving ultrasonic vibrations to said film-shaped object in a direction parallel to said film-shaped object from said electrode connected with a high-frequency power supply; and introducing a reactive gas between said grounded electrode and said electrode connected with a high-frequency power supply to form the carbon coating or the coating mainly containing carbon on said film-shaped object by plasma generated between said grounded electrode and said electrode connected with a high-frequency power supply.

36. The method of claim 35 wherein said carbon coating or said coating mainly containing carbon comprises a diamond-like carbon.

* * * * *